(12) United States Patent
Wu et al.

(10) Patent No.: US 10,090,299 B2
(45) Date of Patent: Oct. 2, 2018

(54) MOSFET TRANSISTORS WITH ROBUST SUBTHRESHOLD OPERATIONS

(71) Applicant: Texas Instruments Incorporated, Dallas, TX (US)

(72) Inventors: Xiaoju Wu, Dallas, TX (US); C. Matthew Thompson, Highland Village, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/865,321

(22) Filed: Jan. 9, 2018

(65) Prior Publication Data

US 2018/0130798 A1    May 10, 2018

Related U.S. Application Data

(63) Continuation of application No. 15/060,736, filed on Mar. 4, 2016, now Pat. No. 9,899,376.

(51) Int. Cl.
*H01L 27/088* (2006.01)
*H01L 29/08* (2006.01)
(Continued)

(52) U.S. Cl.
CPC ........ *H01L 27/088* (2013.01); *H01L 29/0638* (2013.01); *H01L 29/0847* (2013.01); *H01L 29/1033* (2013.01)

(58) Field of Classification Search
CPC .............. H01L 27/088; H01L 29/0847; H01L 29/0638; H01L 29/1033
(Continued)

(56) References Cited

U.S. PATENT DOCUMENTS 6,472,274 B1 * 10/2002 Golz ................. H01L 21/76232
257/510
2002/0006693 A1    1/2002 Matsuda
(Continued)

FOREIGN PATENT DOCUMENTS

KR    20070002576 A    1/2007
KR    20120007715 A    1/2012

OTHER PUBLICATIONS

Notification of Transmittal of the International Search Report and the Written Opinion of the International Searching Authority, or the Declaration; dated Jun. 8, 2017.

*Primary Examiner* — Bo Fan
(74) *Attorney, Agent, or Firm* — Tuenlap D. Chan; Charles A. Brill; Frank D. Cimino

(57) ABSTRACT

An integrated circuit with transistor regions formed on a substrate. Each transistor region includes a channel region and a terminal region. The channel region is positioned along a traverse dimension, and it includes a channel edge region along a longitudinal dimension. The terminal region is positioned adjacent to the channel region, and it is doped with a first dopant of a first conductivity type. Each transistor region may include an edge block region, which is positioned along the longitudinal dimension and adjacent to the channel edge region. The edge block region is doped with a second dopant of a second conductivity type opposite to the first conductivity type. The channel region doped with a dopant and having a first doping concentration. Each transistor region may include an edge recovery region overlapping with the channel edge region and having a second doping concentration higher than the first doping concentration.

20 Claims, 15 Drawing Sheets

(51) Int. Cl.
*H01L 29/06* (2006.01)
*H01L 29/10* (2006.01)

(58) Field of Classification Search
USPC ............... 257/499, 369, 327, 394; 438/199;
326/13; 327/108; 363/127
See application file for complete search history.

(56) References Cited

U.S. PATENT DOCUMENTS

| | | | |
|---|---|---|---|
| 2004/0152244 A1* | 8/2004 | Yamamoto | H01L 21/76213 438/142 |
| 2008/0188045 A1 | 8/2008 | Morris | |
| 2010/0038728 A1* | 2/2010 | Anderson | H01L 21/82380 257/410 |
| 2010/0041199 A1* | 2/2010 | Anderson | H01L 21/76283 438/285 |
| 2013/0020707 A1 | 1/2013 | Or-Bach | |
| 2013/0095580 A1 | 4/2013 | Or-Bach | |
| 2015/0348945 A1 | 12/2015 | Or-Bach | |

\* cited by examiner

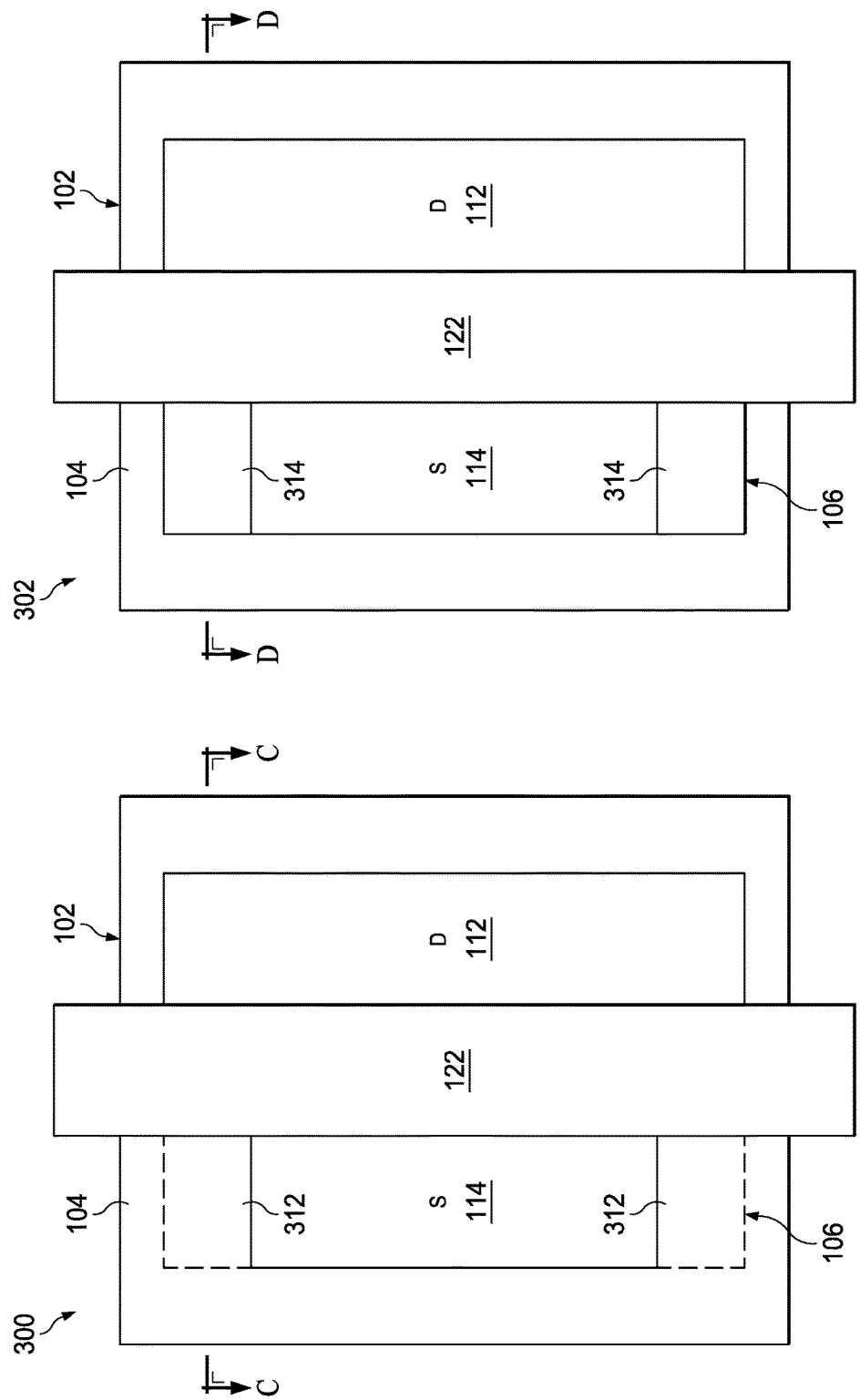

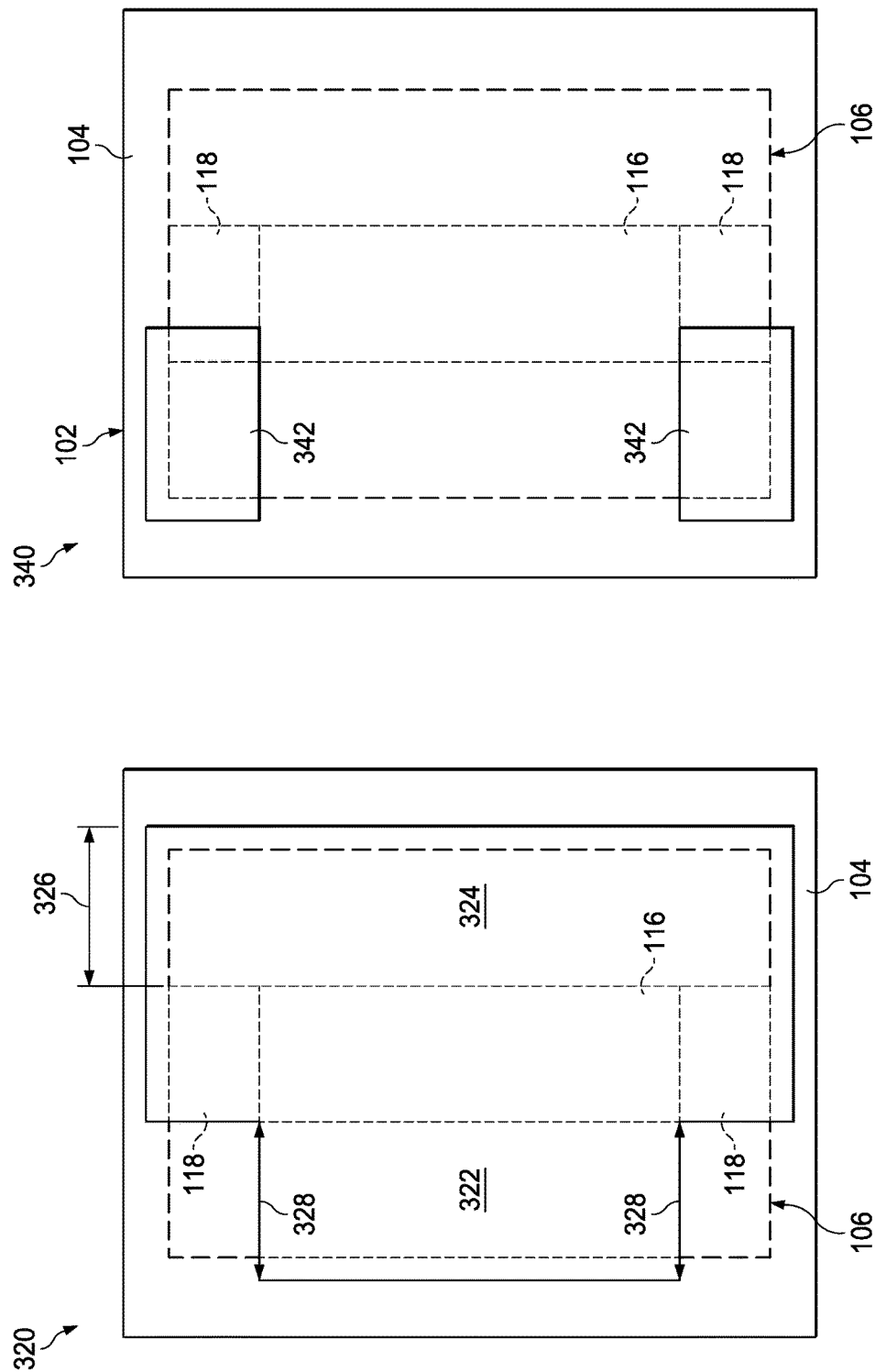

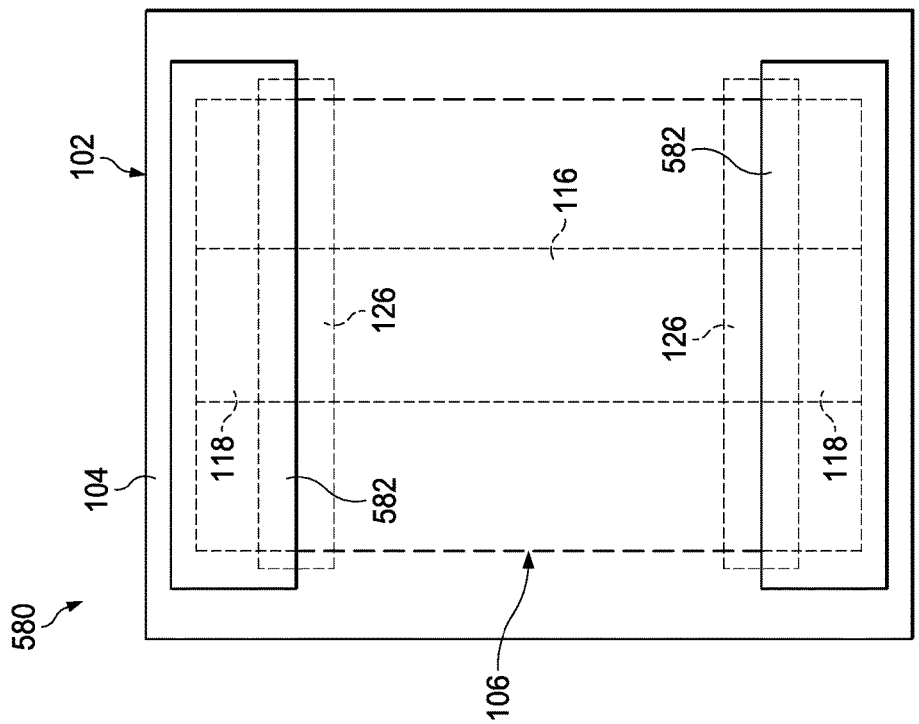
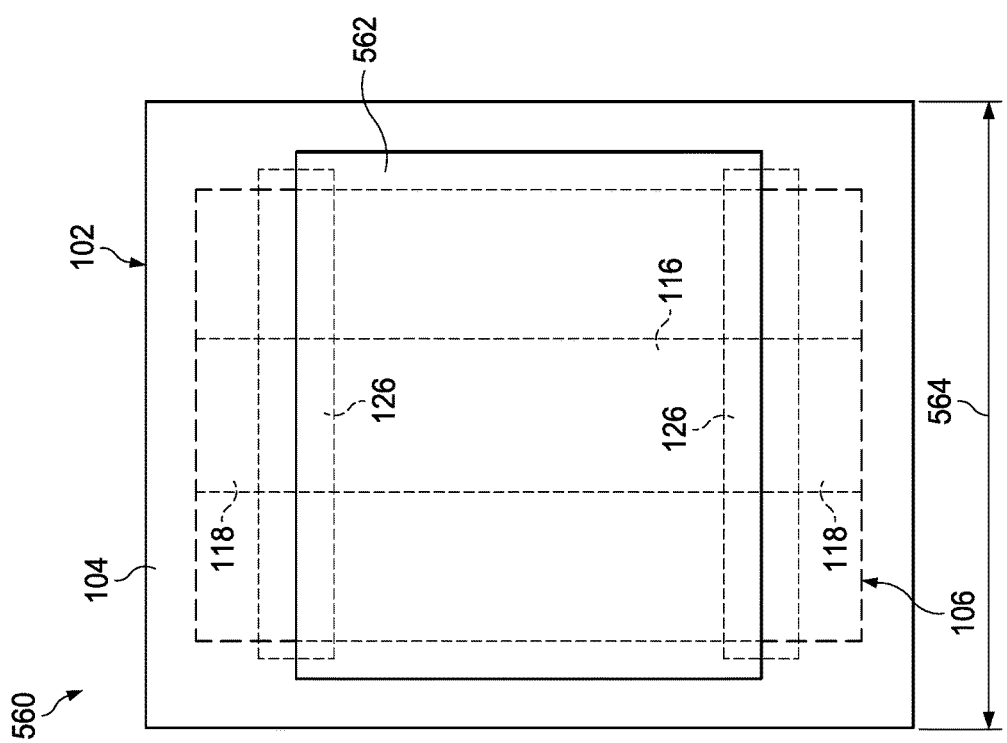

MOSFET TRANSISTORS WITH ROBUST SUBTHRESHOLD OPERATIONS

CROSS REFERENCE TO RELATED APPLICATIONS

Under 35 U.S.C. § 120, this continuation application claims benefits of and priority to U.S. patent application Ser. No. 15/060,736, filed on Mar. 4, 2016, the entirety of which are hereby incorporated herein by reference.

BACKGROUND

Transistors for use in low current analog integrated circuits may be expected to operate in subthreshold voltages. Transistor matching generally affect the performance and precision of an analog circuitry. Parasitic components of a transistor may impact the transistor's matching capability. For example, certain channel related parasitic components may lower the threshold voltage of a transistor, thereby affecting the transistor's performance and precision in subthreshold operations. Thus, there is a need for a transistor that suppresses and/or eliminate channel parasitic components to sustain robust subthreshold operations.

SUMMARY

The present disclosure describes systems and techniques relating to the manufacturing of integrated circuits having one or more metal-oxide-semiconductor (MOS) transistors. The disclosed MOS transistors provide robust subthreshold operation by suppressing and/or eliminating parasitic components associated with the channel region. These parasitic components are located around a longitudinal edge of a channel, and they may lower the overall threshold voltage of a transistor and distort the subthreshold behavior of the transistor. These parasitic components can be suppressed by shifting the threshold voltage at the edge of a transistor channel. Moreover, these parasitic components can be eliminated by blocking the edge of a transistor channel from conducting subthreshold currents.

In one implementation, for example, the present disclosure describes an integrated circuit with several transistor regions formed on a substrate. The transistor regions are spaced apart from one another, and each of the transistor regions is defined by a longitudinal dimension and a traverse dimension. Each of the transistor regions includes a channel region, a terminal region, and an edge block region. The channel region is positioned along the traverse dimension, and it includes a channel edge region along the longitudinal dimension. The terminal region is positioned adjacent to the channel region, and it is doped with a first dopant of a first conductivity type. The edge block region is positioned along the longitudinal dimension and adjacent to the channel edge region. The edge block region is doped with a second dopant of a second conductivity type opposite to the first conductivity type. Moreover, the disclosed integrated circuit includes gate electrodes positioned above the channel regions of the transistors.

In another implementation, for example, the present describes demonstrates an integrated circuit with several n-channel transistor regions formed on a substrate. The transistor regions are spaced apart from one another, and each of the transistor regions is defined by a longitudinal dimension and a traverse dimension. Each of the transistor regions includes a channel region, a terminal region, and an edge block region. The channel region is positioned along the traverse dimension, and it includes a channel edge region along the longitudinal dimension. The terminal region is positioned adjacent to the channel region, and it is doped with n-type dopants. The edge block region is positioned along the longitudinal dimension and adjacent to the channel edge region. The edge block region is doped with p-type dopants. Moreover, the disclosed integrated circuit includes gate electrodes positioned above the channel regions of the transistors.

In yet another implementation, for example, the present disclosure describes an integrated circuit with several transistor regions formed on a substrate. The transistor regions are spaced apart from one another, and each of the transistor regions is defined by a longitudinal dimension and a traverse dimension. Each of the transistor regions includes a channel region and an edge recovery region. The channel region is positioned along the traverse dimension, and it includes a channel edge region along the longitudinal dimension. The channel region is doped with a dopant and having a first doping concentration. The edge recovery region overlaps with the channel edge region, and it is doped with the same dopant and has a second doping concentration that is higher than the first doping concentration. Moreover, the disclosed integrated circuit includes gate electrodes positioned above the channel regions of the transistors.

DRAWING DESCRIPTIONS

FIG. 3A shows a top view of a regressive edge block MOS transistor according to an aspect of the present disclosure.

FIG. 3B shows a top view of a progressive edge block MOS transistor according to an aspect of the present disclosure.

FIG. 3E shows a top view of a regressive edge block mask according to an aspect of the present disclosure.

FIG. 3F shows a top view of a progressive edge block mask according to an aspect of the present disclosure.

FIG. 5F shows a top view of a dual self-aligned segregated regressive edge block mask according to an aspect of the present disclosure.

FIG. 5G shows a top view of a dual self-aligned segregated progressive edge block mask according to an aspect of the present disclosure.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1A:
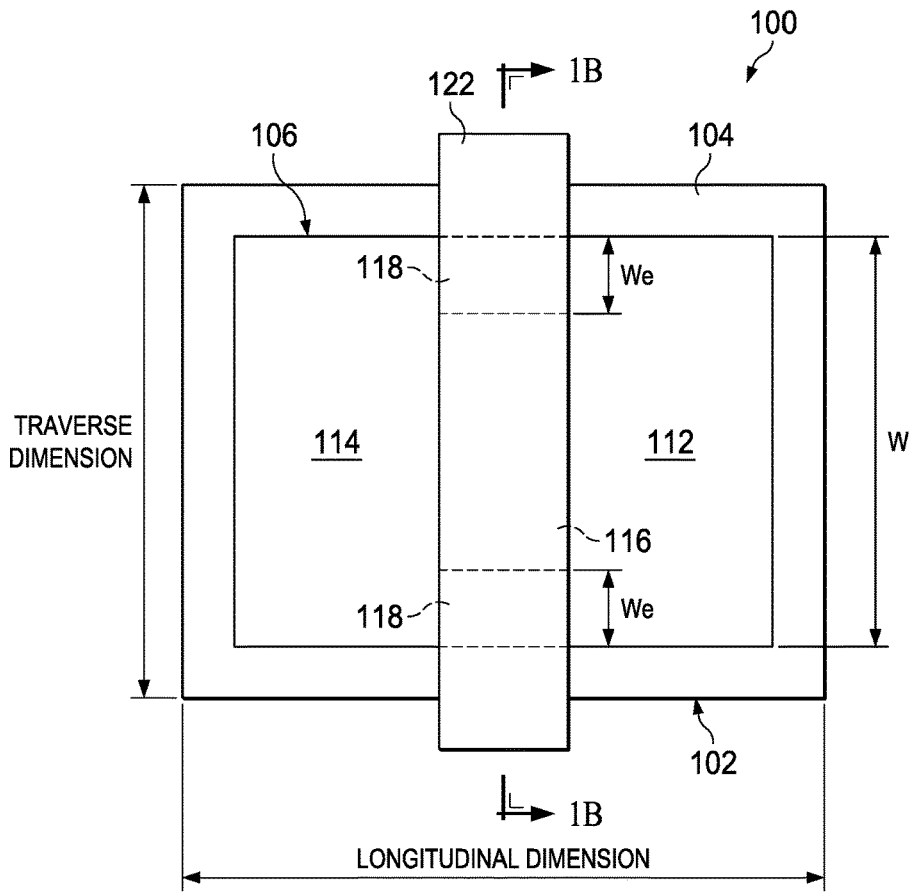
FIG. 1A shows a top view of a metal-oxide-semiconductor (MOS) transistor according to an aspect of the present disclosure.
Figure 1B:
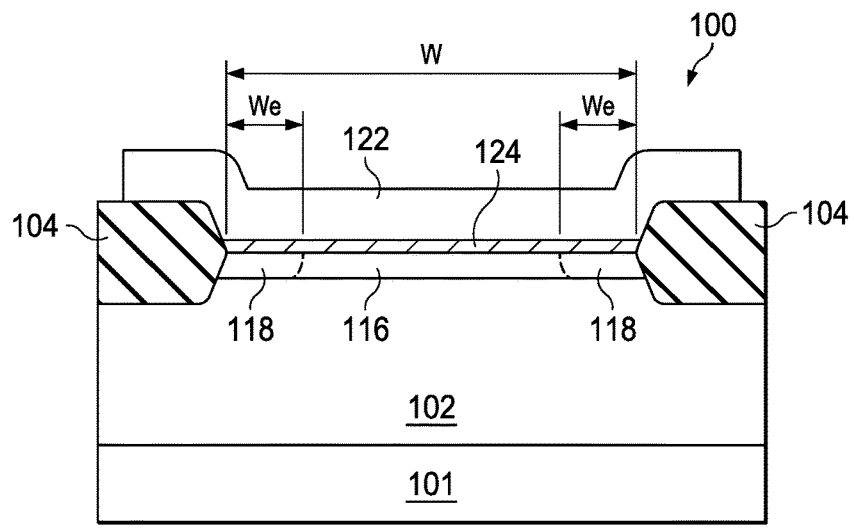
FIG. 1B shows a cross-sectional view of the MOS transistor according to an aspect of the present disclosure.

FIGS. 1A-1B show a top view and a traverse cross-sectional view A of a metal-oxide semiconductor (MOS) transistor 100. The MOS transistor 100 is formed on a substrate 101, which may include multiple instances of the MOS transistor 100, which are spaced apart from one another and interconnected to form an integrated circuit. The MOS transistor 100 includes a well 102, which is formed by implanting impurities into the substrate 101. For example, the well 102 may include lightly doped p-type materials (e.g., boron) where the MOS transistor 100 is an n-channel device; or alternatively, the well 102 may include lightly doped n-type material (e.g., phosphorous) where the MOS transistor 100 is a p-channel device. The MOS transistor 100 is isolated by an isolation structure 104, which can be a local oxidation of silicon (LOCOS) structure or a shallow trench isolation (STI) structure. The isolation structure 104 laterally surrounds and thus isolates a transistor active region (hereinafter "transistor region") 106 within the well 102.

The transistor region 106 is defined by a longitudinal dimension and a traverse dimension. In general, the longitudinal dimension is associated with a channel length of the MOS transistor 100, whereas the traverse dimension is associated with the channel width of the MOS transistor 100. The transistor region 106 includes a channel region 116, a first terminal region 112, and a second terminal region 114. The channel region 116 is positioned along the traverse dimension. The channel region 116 may be a part of the well 102 or enhanced with the same dopant as the well 102 but with a different doping concentration. Where the MOS transistor 100 is an n-channel device, for instance, the channel region 116 may be a part of a p-well (e.g., 102) in one implementation, or the channel region 116 may be doped with a p-type dopant at a doping concentration higher than the p-well (e.g., 102). Where the MOS transistor 100 is an p-channel device, for instance, the channel region 116 may be a part of an n-well (e.g., 102) in one implementation, or the channel region 116 may be doped with an n-type dopant at a doping concentration higher than the n-well (e.g., 102).

The channel region 116 generally positioned along the traverse dimension and in the mid-section of the transistor region 106. The first terminal region 112 and the second terminal region 114 are positioned adjacent to the channel region 116 to form a sandwich configuration with the channel region 116. Typically, the terminal regions 112 and 114 include a dopant of a conductivity type that is opposite to that of the channel region 116. In an n-channel device, for instance, the terminal regions 112 and 114 are doped with n-type dopants (e.g., phosphorous); or alternatively, in a p-channel device, for instance, the terminal regions 112 and 114 are doped with p-type dopants (e.g., boron). Either one of the terminal regions 112 and 114 can be adapted as a source node or a drain node of the MOS transistor 100. For the purpose of the following disclosure, the first terminal region 112 is designated as the drain node (or drain region) and the second terminal region 114 is designated as the source node (or source region). In practice, however, a reverse designation is also possible.

The MOS transistor 100 includes a gate structure positioned above the channel region 116. The gate structure includes a gate oxide layer 124 and a gate electrode 122. The gate oxide layer 124 may include a silicon dioxide material. The gate electrode 122 may be formed using polysilicon epitaxial growth. The gate electrode 122 may extend along the traverse dimension to overlap the isolation structure 104. The gate electrode 122 may also be used as a self-alignment means for forming the terminal regions 112 and 114.

The channel region 116 includes channel edge regions 118 abutting the isolation structure 104 along the longitudinal dimension. After the isolation structure 104 is formed, the dopants within the channel edge regions 118 may migrate to the isolation structure 104. In an n-channel device (e.g., an NMOS transistor), for instance, the dopant migration can be significant enough to cause an uneven dopant concentration in the channel region 116 along the traverse dimension. Specifically, the channel edge regions 118 may have a lower doping concentration than the channel main region (i.e., the channel region 116 without dopant migration and positioned adjacent to the channel edge regions 118). The lower doping concentration at the channel edge regions 118 may lower the threshold voltage $V_T$ around the channel edge regions 118 of the MOS transistor 100. In the event that the MOS transistor 100 is deployed in a low current circuitry (e.g., average current that is less than 100 nA), the lower threshold voltage $V_T$ around the channel edge regions 118 may degrade transistor matching of the low current circuitry. The degraded transistor matching may also impact the analog application precision of the low current circuitry.

Figure 1C:
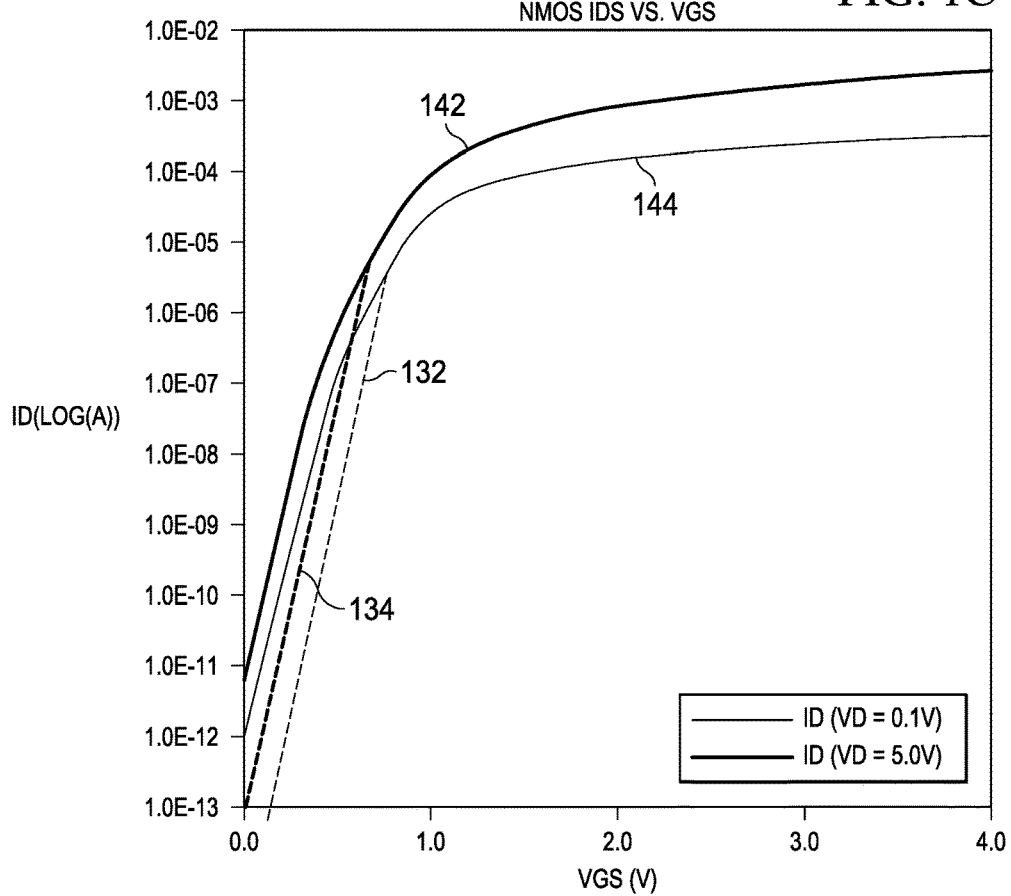
FIG. 1C shows a voltage-dependent current chart of the MOS transistor according to an aspect of the present disclosure.

As shown in FIG. 1C, for example, slope 132 and slope 134 represent the expected behavior of the MOS transistor 100 operating in a subthreshold condition (i.e., the gate-source bias $V_{GS}$ less than the threshold voltage $V_T$). Slope 132 represents the current flowing through the channel region 116 when the drain-source bias $V_{DS}$ is about 0.1 V; whereas slope 134 represents the current flowing through the channel region 116 when the drain-source bias $V_{DS}$ is about 5 V. For transistor matching, slopes 132 and 134 are expected to be linear within the subthreshold region. However, due to the parasitic effects contributed by the channel edge regions 118, the actual slopes 142 and 144 deviate from the expected slopes 132 and 134 in two aspects. First, the channel edge regions 118 may begin to conduct a substantial amount of current (e.g., $1\times10^{-12}$ A to $1\times10^{-11}$ A as shown in FIG. 1C) even when the gate-source bias $V_{GS}$ is at 0V, thereby causing a substantial leakage when the MOS transistor 100 is supposed to be turned off. Second, the actual slopes 142 and 144 are less linear when compared to the expected slopes 132 and 134, which may impact the matchability of the MOS transistor 100. The deviation caused by the channel edge region 118 is inversely proportional to the square-root of the channel width (W) of the channel region 116 (see FIGS. 1A and 1B). This is because the channel edge width (We) of the channel edge regions 118 is relatively constant against channel width (W) variations. As the channel width (W) becomes smaller, the channel edge width (We) takes up a larger portion of the channel width (W), and the subthreshold deviation may become more prominent.

The present disclosure provides various solutions to overcome the subthreshold deviation as described above. In one implementation, the disclosed solutions introduce MOS transistors that suppress the parasitic effects of the channel edge regions (e.g., 118) by shifting the threshold voltage within the channel edge regions. FIGS. 2A-2E illustrate several aspects of the parasitic suppression solutions. In another implementation, the disclosed solutions introduce MOS transistors that eliminate the parasitic effects of the channel edge regions by preventing the channel edge regions (e.g., 118) from conducting subthreshold currents. FIGS. 3A-3F, 4A-4H, and 5A-5G illustrates several aspects of the parasitic elimination solutions.

Figure 2C:
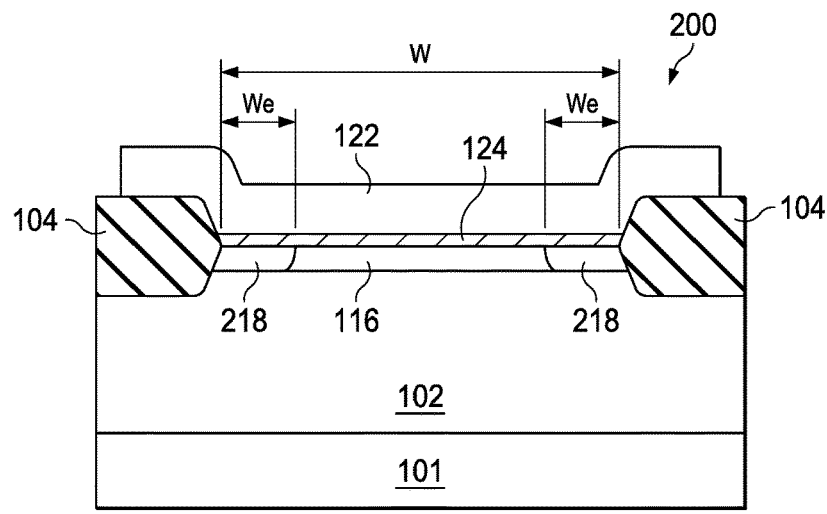
FIG. 2C shows a cross-sectional view of the edge recovery MOS transistor according to an aspect of the present disclosure.
Figure 2B:
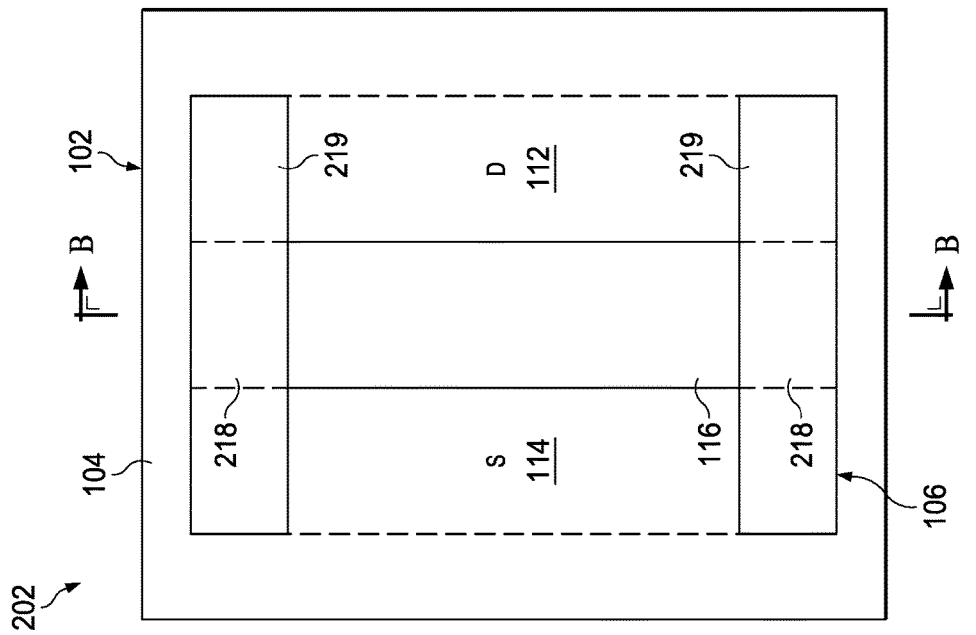
FIG. 2B shows a top view of an extended edge recovery MOS transistor according to an aspect of the present disclosure.
Figure 2A:
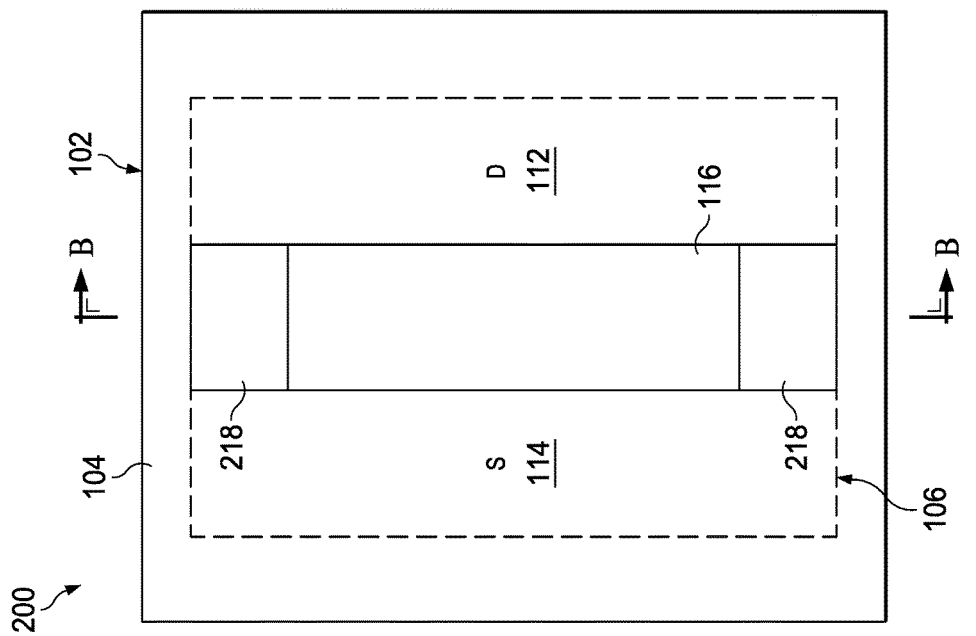
FIG. 2A shows a top view of an edge recovery MOS transistor according to an aspect of the present disclosure.
Figure 2E:
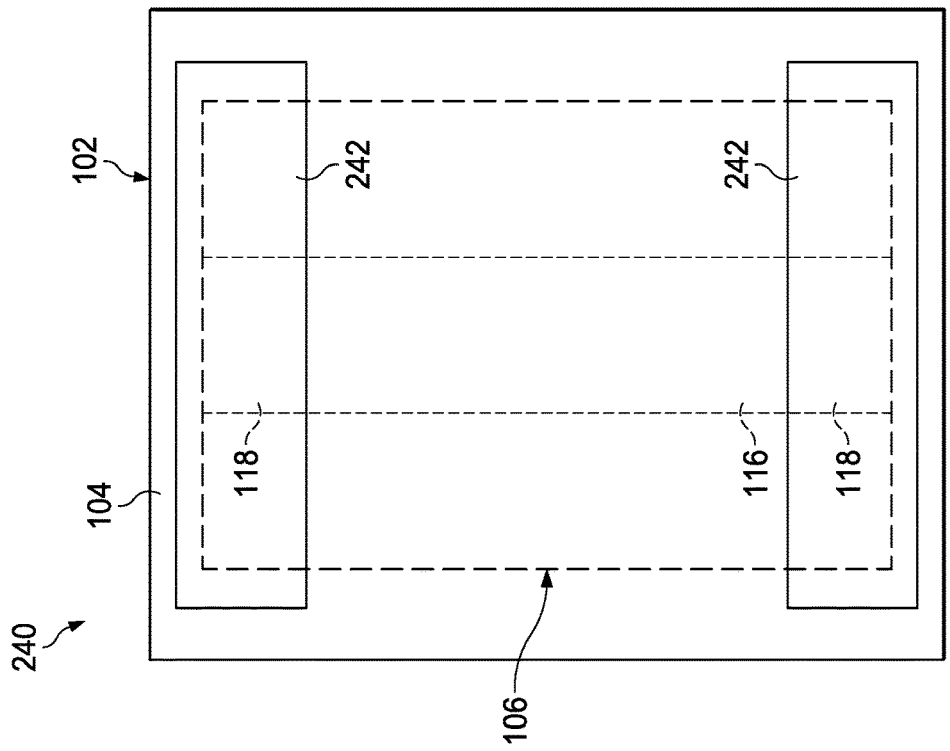
FIG. 2E shows a top view of an extended edge recovery mask according to an aspect of the present disclosure.

Referring to FIGS. 2A, 2C (cross-section B as shown in FIG. 2A), and 2D, several features of an edge recovery MOS (ERMOS) transistor 200 are shown according to an aspect of the present disclosure. The ERMOS transistor 200 is similar to the MOS transistor 100 with respect to their overall structures. Thus, several numeric labels of the ERMOS transistor 200 are adopted from the MOS transistor 100 to the extent that these numeric labels refer to the structural features common to both transistors 100 and 200. The ERMOS transistor 200 is different from the MOS transistor 100 in that the ERMOS transistor 200 provides channel parasitic suppression by a channel edge recovery means. More specifically, the ERMOS transistor 200 includes one or more edge recovery regions 218 that overlaps with the channel edge regions 118 and abutting the isolation structure 104 along the longitudinal direction. As previously disclosed, the channel region 116, which includes the channel edge regions 118, may be doped with a dopant with a certain doping concentration. Due to dopant migrations, the channel edge regions 118 may have a lower dopant concentration than the center part of the channel region 116. The edge recovery regions 218 purport to recover the migrated dopants by doping a part of, or the entire, channel edge regions 118 with the same dopant and a doping concentration that is higher than that of the channel region 116. In an n-channel device, for instance, the edge recovery regions 218 may be doped with a p-type dopant (e.g., boron); alternatively in a p-channel device, the edge recovery regions 218 may be doped with an n-type dopant (e.g., phosphorous).

In one implementation, the doping concentration of the edge recovery region 218 can be sufficiently high to restore the doping concentration of the channel edge regions 118, such that the channel region 116 may have a more uniform doping concentration. In one implementation, for example, the doping concentration of the edge recovery region 218 may ranges from $9\times10^{15}$ cm$^{-3}$ to $1\times10^{17}$ cm$^{-3}$. In another implementation, for example, the doping concentration of the edge recovery region 218 may ranges from $2\times10^{15}$ cm$^{-3}$ to $1\times10^{16}$ cm$^{-3}$. Advantageously, the edge recovery regions 218 helps restore the threshold voltage $V_T$ to its expected value, thereby providing a precise and robust subthreshold performance for the ERMOS transistor 200. In another implementation, the doping concentration of the edge recovery region 218 can be sufficiently high to raise the threshold voltage at the channel edge regions 118 above its expected value (e.g., the doping concentration of the channel region 116). As such, the channel edge regions 118 do not conduct a substantial amount of subthreshold current (see, e.g., slopes 132 and 134 in FIG. 1C). In one implementation, for example, the doping concentration of the edge recovery region 218 may be $2\times10^{17}$ cm$^{-3}$ or above. In another implementation, for example, the doping concentration of the edge recovery region 218 may be at least half an order of a magnitude higher than that of the channel region 116. Assuming, for instance, the doping concentration of the channel region 116 is $5\times10^{16}$ cm$^{-3}$ then the doping concentration of the edge recovery region 218 can be $1\times10^{17}$ cm$^{-3}$. Similarly, assuming the doping concentration of the channel region 116 is $1\times10^{16}$ cm$^{-3}$ then the doping concentration of the edge recovery region 218 can be $5\times10^{16}$ cm$^{-3}$. Advantageously, the edge recovery regions 218 helps suppress the edge parasitic of the channel regions 116 by substantially reducing the subthreshold operation of the channel edge region 118 (see, e.g., slopes 132 and 134 in FIG. 1C). In this particular implementation, the effective channel width of the ERMOS transistor 200 is approximately the channel width (W) subtracted by two times the channel edge width (We).

The edge recovery regions 218 can be developed by selectively implanting the well 102 with an edge recovery (ER) mask 220. The ER mask 220 defines one or more openings 222, each of which may overlap with one of the channel edge regions 118. Moreover, the openings 222 may extend outside of the transistor region 106 to overlap with the isolation structure 104 along the longitudinal dimension. In general, the edge recovery regions 218 may be developed after the well 102 is formed and after the isolation structure 104 is formed. The ER mask 220 may define additional openings for implanting the entire channel region of other channel enhanced transistors (e.g., a transistor similar to the MOS transistor 100 except that the channel region 116 has a higher doping concentration than the well 102). For example, while the ERMOS transistor 200 may be a 5V transistor (i.e., Maximum $|V_{DS}|=5V$), the additional openings of the ER mask 220 can be used for doping the channel of a 3V transistor (i.e., Maximum $|V_{DS}|=3V$).

Figure 2D:
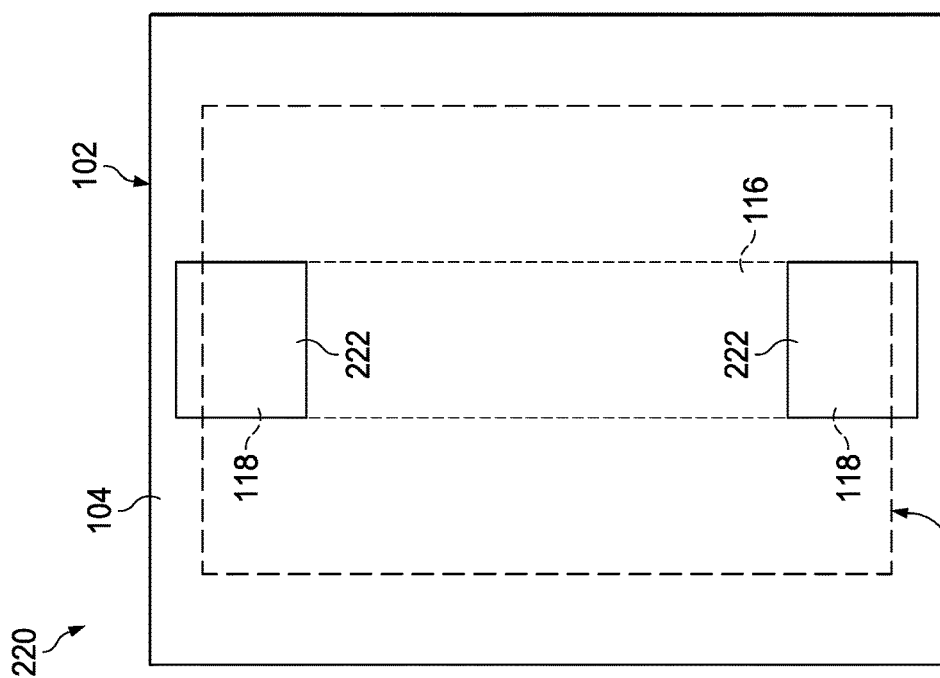
FIG. 2D shows a top view of an edge recovery mask according to an aspect of the present disclosure.

To improve the process margin for developing the edge recovery regions 218, the edge recovery regions 218 may extend beyond the channel region 116 to overlap with the terminal regions 112 and/or 114. Referring to FIGS. 2A, 2C, and 2D, several features of an extended edge recover MOS (EERMOS) transistor 202 are shown according to an aspect of the present disclosure. The EERMOS transistor 202 includes similar structures as the ERMOS transistor 200. For example, the EERMOS transistor 202 includes the edge recovery regions 218. Thus, the EERMOS transistors 220 incorporates the advantageous features of the ERMOS transistor 200 as described previously. In addition, the EERMOS transistor 202 includes one or more extended edge recovery regions 219 extending from the edge recovery regions 218.

The extended edge recovery region 219 can be developed alongside with the edge recovery regions 218 using an extended edge recovery (EER) mask 240. The EER mask 240 defines one or more openings 242, each of which may overlap with one of the channel edge regions 118 and extend across the transistor region 106 across the longitudinal dimension. Moreover, the openings 242 may extend outside of the transistor region 106 to overlap with the isolation structure 104 along the longitudinal dimension. In general, the edge recovery regions 218 and the extended edge recovery regions 219 may be developed after the well 102 is formed and after the isolation structure 104 is formed. The EER mask 240 may define additional openings for implanting the entire channel region of other channel enhanced transistors (e.g., a transistor similar to the MOS transistor 100 except that the channel region 116 has a higher doping concentration than the well 102). For example, while the EERMOS transistor 202 may be a 5V transistor (i.e., Maximum $V_{DS}=5V$), the additional openings of the EER mask 240 can be used for doping the channel of a 3V transistor (i.e., Maximum $|V_{DS}|=3V$).

Besides parasitic suppression, the present disclosure introduces various mechanisms to eliminate the parasitic effects of the channel edge region (e.g., 118). In one implementation, an edge block region is formed for eliminating parasitic effects of the channel edge region. The edge block region abuts the terminal region (e.g., 112 or 114) along the longitudinal dimension, and the edge block region is generally positioned adjacent to the channel edge region. The edge block region is doped with a dopant having a conductivity type opposite to the dopants of the terminal regions (e.g., 112 and 114). In an n-channel device, for instance, the edge block region is doped with a p-type material (e.g., boron); alternatively in a p-channel device, the edge block region is doped with an n-type material (e.g., phosphorous). Due to its proximity to the channel edge region and its opposite conductivity to the terminal region, the edge block region prevents the channel edge region from conducting a current when the gate electrode (e.g., 122) receives a subthreshold voltage.

Figure 3C:
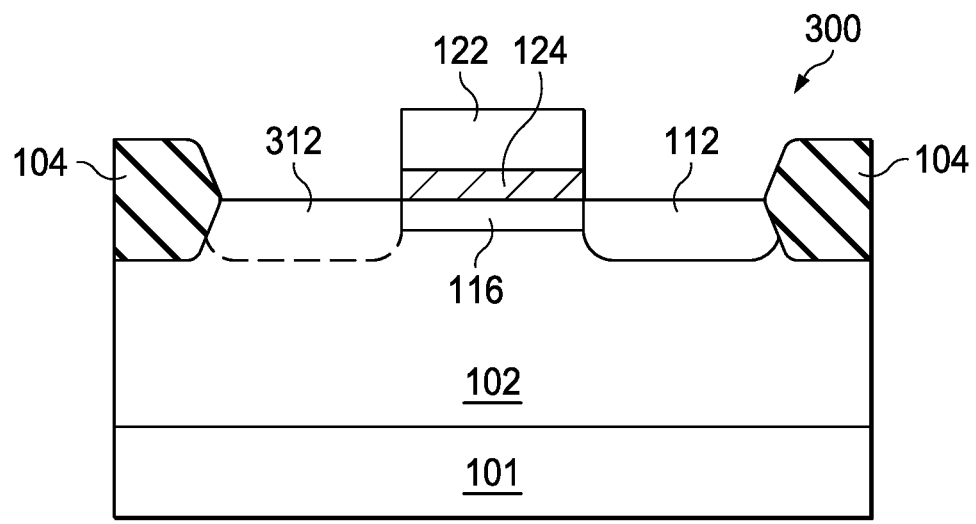
FIG. 3C shows a cross-sectional view of the regressive edge block MOS transistor according to an aspect of the present disclosure.
Figure 3D:
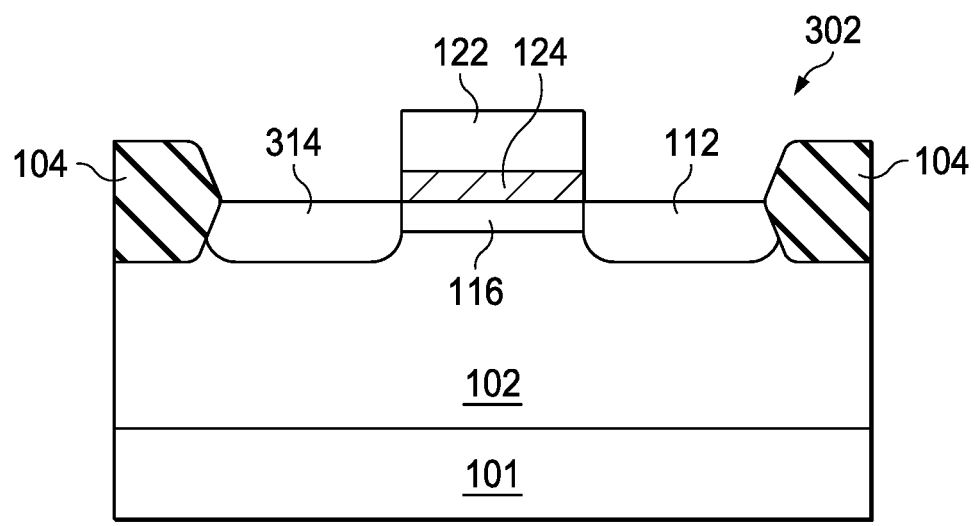
FIG. 3D shows a cross-sectional view of the progressive edge block MOS transistor according to an aspect of the present disclosure.

The present disclosure introduces several types of edge block regions (hereinafter "edge blockers"). For example: FIGS. 3A, 3C, and 3E illustrate a regressive edge block region 312; FIGS. 3B, 3D, and 3F illustrate a progressive edge block region 314; FIGS. 4A, 4C-4D, 4G-4H, 5A and 5C-5E illustrate a segregated progressive edge block region 412; FIGS. 4B, 4E-4F, 5B, and 5F-5G illustrate the segregated progressive edge block region 412 with self-alignment.

Referring to FIGS. 3A, 3C (cross-section C of FIG. 2A), and 3E, several features of a regressive edge block MOS (REBMOS) transistor 300 are shown according to an aspect of the present disclosure. The REBMOS transistor 300 is similar to the MOS transistor 100 with respect to their overall structures. Thus, several numeric labels of the REBMOS transistor 300 are adopted from the MOS transistor 100 to the extent that these numeric labels refer to the structural features common to both transistors 100 and 300. The REBMOS transistor 300 is different from the MOS transistor 100 in that the REBMOS transistor 300 provides channel parasitic elimination by a channel edge blockage means. More specifically, the REBMOS transistor 300 includes one or more regressive edge blockers 312 positioned adjacent to the channel edge regions 118 and one of the terminal regions 112 or 114. In one implementation, the REBMOS transistor 300 may include two regressive edge blocks 312, both positioned adjacent to the source terminal region 114. In another implementation, the REBMOS transistor 300 may include two regressive edge blocks 312, both positioned adjacent to the drain terminal 112. In yet another implementation, the REBMOS transistor 300 may include two regressive edge blocks 312, with a first one positioned adjacent to the source terminal 114 and a second one positioned adjacent to the drain terminal 112.

The regressive edge blocker 312 may be formed as a part of the well 102. In particular, the regressive edge blocker 312 is regressive because it is formed by regressing the associated terminal region 112 or 114 (e.g., terminal region 114 as shown in FIG. 3A) to decouple from the channel edge regions 118. Thus, the regressive edge blocker 312 can be contiguous with the well 102 and may include the same type of dopant and similar doping concentration as the well 102. In an n-channel device, for instance, the regressive edge blocker 312 may be doped with a p-type dopant (e.g., boron); alternatively in a p-channel device, the regressive edge blocker 312 may be doped with an n-type dopant (e.g., phosphorous).

The regressive edge blockers 312 prevents the channel edge region 118 from conducting a current because the regressive edge blockers 312 have an opposite conductivity to the channel created in the channel block regions 118. Advantageously, the regressive edge blockers 312 eliminate subthreshold non-linearity and the leakage current conducted by the channel edge regions 118. The regressive edge blockers 312 helps maintain an effective channel width of the REBMOS transistor 300 at approximately the physical channel width (W) subtracted by two times the channel edge width (We).

The regressive edge blockers 312 can be developed by selectively implanting the well 102 with a regressive edge block (REB) mask 320. The REB mask 320 defines a first opening 322 and a second opening 324. The regressive edge blockers 312 are formed next to the first opening 322, which is defined by one or more regressive edge 328. The regressive edge 328 regresses from the longitudinal side of the transistor region 106 to prevent the associated terminal region 112 or 114 (e.g., 114 as shown in FIG. 3E) from abutting the channel edge region 118. The first opening 322 may extend outside of the transistor region 106 to overlap with the isolation structure 104 along the traverse dimension. The second opening 324 is defined by one or more non-regressive edge 326, which may extend beyond the transistor region 106 along the longitudinal dimension and the traverser direction.

In general, the regressive edge blockers 312 may be developed after: the well 102 is formed; the isolation structure 104 is formed; and the gate structure (e.g., the gate oxide layer 124 and the gate electrode 122) is formed. Thus, the gate structure may serve as a self-alignment tool to segregate the first terminal region 112 from the second terminal region 114. Such a self-alignment tool allows a wider process margin for the formation of the terminal regions 112 and 114. And with a wider process margin, the first opening 322 may join the second opening 324 to form a single opening that overlap with the channel region 116 as the gate structure will prevent the terminal region dopants from entering the channel region 116. The REB mask 320 may define additional openings for implanting both source and drain terminal regions of other transistors, such as those of the ERMOS transistor 200, but without forming the regressive edge blockers 312 therein. Advantageously, the terminal regions 112 and 114 of the ERMOS transistor 200 and the regressive edge blockers 312 of the REBMOS transistor 300 can be developed with a single mask 320 to achieve process efficiency.

The regressive edge blockers 312 may be enhanced with additional dopants. Referring to FIGS. 3B, 3D (cross-section D of FIG. 3A), and 3F, several features of a progressive edge block MOS (PEBMOS) transistor 302 are shown according to an aspect of the present disclosure. The PEBMOS transistor 302 shares similar structures as the REBMOS transistor 300. For example, the PEBMOS transistor 302 defines the REB regions 312 in substantially the same way as the REBMOS transistor 300, and thus the PEBMOS transistor 302 incorporates the advantageous features of the REBMOS transistor 300 as described previously. In addition, the PEBMOS transistor 302 includes one or more progressive edge block (PEB) regions (or progressive edge blockers) 314 to enhance the edge blocking function of the REB regions 312. Specifically, the PEB regions 314 is doped with dopants having the opposite conductivity type to the terminal regions 112 and 114, and the PEB regions 314 have a higher doping concentration than the well 102. In one implementation, for example, the PEB regions 314 may have a doping concentration that is comparable to the doping concentration of the terminal regions 112 and 114.

The PEB regions 314 can be developed by selectively implanting the well 102 with the regressive edge block (REB) mask 320 and a PEB mask 340. The PEB mask 340 defines openings 342 that overlap with the REB regions 312. The PEB regions 314 are formed by implanting the REB regions 312 through the openings 342. The PEB regions 314 may be formed either before or after the REB mask 320 is applied. To widen the process margin, the opening 342 may extend outside of the transistor region 106 to overlap with the isolation structure 104 along the longitudinal dimension and the traverse dimension.

In general, the PEB regions 314 may be developed after: the well 102 is formed; the isolation structure 104 is formed; and the gate structure (e.g., the gate oxide layer 124 and the gate electrode 122) is formed. Thus, the gate structure may serve as a self-alignment tool to segregate the first terminal region 112 from the second terminal region 114. Such a self-alignment tool allows a wider process margin for the formation of the PEB regions 314. And with a wider process margin, the opening 342 also extend to the channel edge regions 118 as the gate structure will prevent the PEB dopants from entering the channel edge regions 118. The PEB mask 340 may define additional openings for implanting both source and drain terminal regions of other transistors having the opposite conductivity type.

For instance, the PEB mask 340 may define the PEB regions 314 of an n-channel transistor and the drain-source terminal regions 112 and 114 of a p-channel transistor at the same time. In this particular configuration, the PEG regions 314 of the n-channel transistor may have the same dopants and doping concentration as the terminal regions 112 and 114 of the p-channel transistor. Alternatively, the PEB mask 340 may define the PEB regions 314 of a p-channel transistor and the drain-source terminal regions 112 and 114 of an n-channel transistor at the same time. In this particular configuration, the PEG regions 314 of the p-channel transistor may have the same dopants and doping concentration as the terminal regions 112 and 114 of the n-channel transistor.

In either configuration, a single mask may incorporate the REB mask 320 for a first transistor having a first conductivity type and the PEB mask 340 for a second transistor having a second conductivity type opposite to the first conductivity type. For instance, a first single mask may incorporate the REB mask 320 for an n-channel transistor (e.g., a first transistor) and the PEB mask 340 for a p-channel transistor (e.g., a second transistor), whereas a second single mask may incorporate the REB mask 320 for the p-channel transistor (e.g., the second transistor) and the PEB mask 340 for the n-channel transistor (e.g., the first transistor). This single mask implementation streamlines the process for forming the REB regions 312 and the PEB regions of CMOS transistors, and thus it provides high process efficiency to the fabrication of CMOS circuitries.

The REBMOS transistor 300 and the PEBMOS transistor 302 as shown and described in FIG. 3A-3F generally have a terminal region (e.g., the source terminal region 114) that is contiguous with an edge block region (e.g., the REB 312 and/or the PEB 314). Because the edge block region shares the same conductivity type with the well (e.g., 102), the terminal region may share the same bias with the body region (e.g., a part of the well 102) of the transistor (i.e., the REBMOS transistor 300 and/or the PEBMOS transistor 302) after subsequent metallization (e.g., formation of a titanium silicide layer) of the terminal region and the edge block region. In the event that the terminal region (e.g., the source terminal region 114) is to be biased separately from the body region, the edge block region can be segregated from the terminal region by a spacer structure. The spacer structure prevents a subsequently formed metal layer from electrically connecting the terminal region to the edge block region.

Figure 4B:
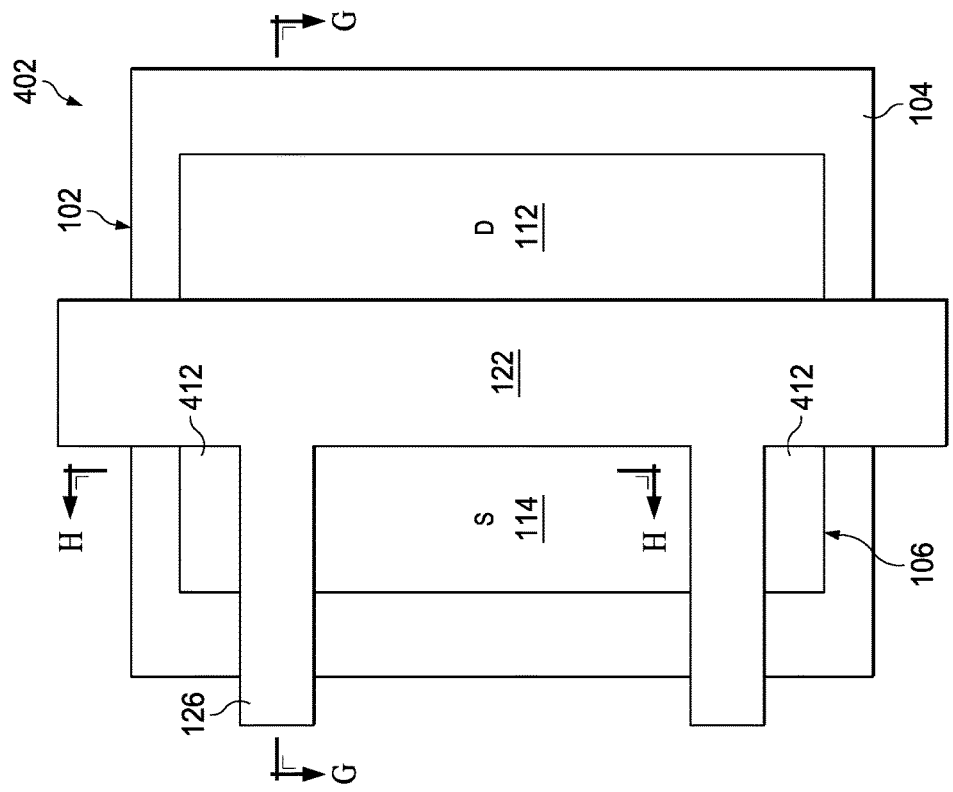
FIG. 4B shows a top view of a self-aligned segregated progressive edge block MOS transistor according to an aspect of the present disclosure.
Figure 4A:
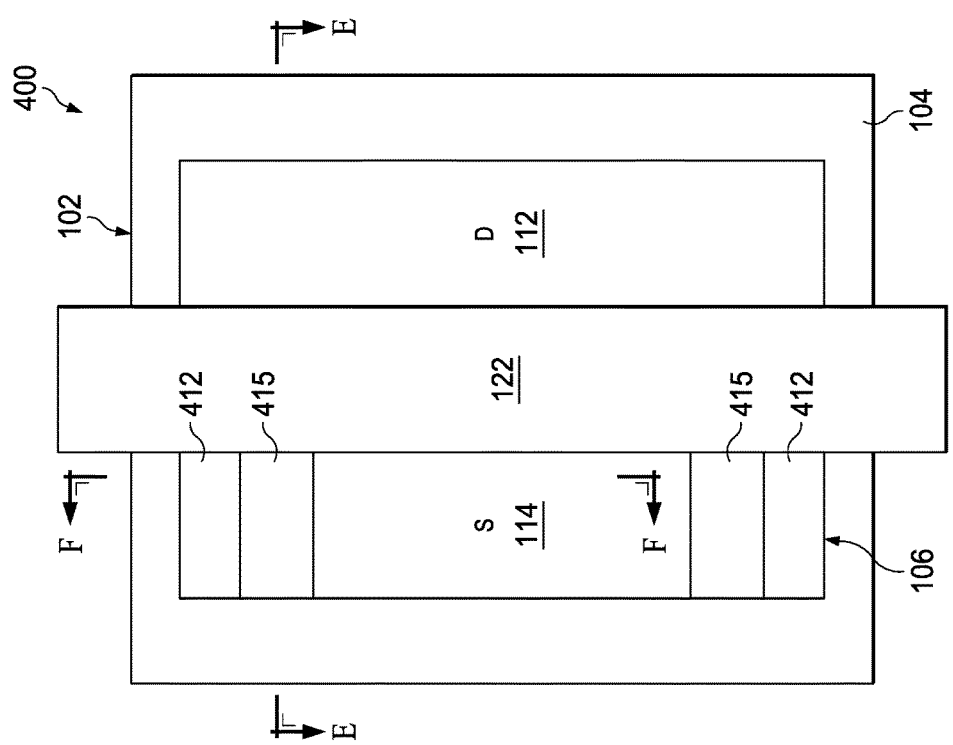
FIG. 4A shows a top view of a segregated regressive edge block MOS transistor according to an aspect of the present disclosure.
Figure 4C:
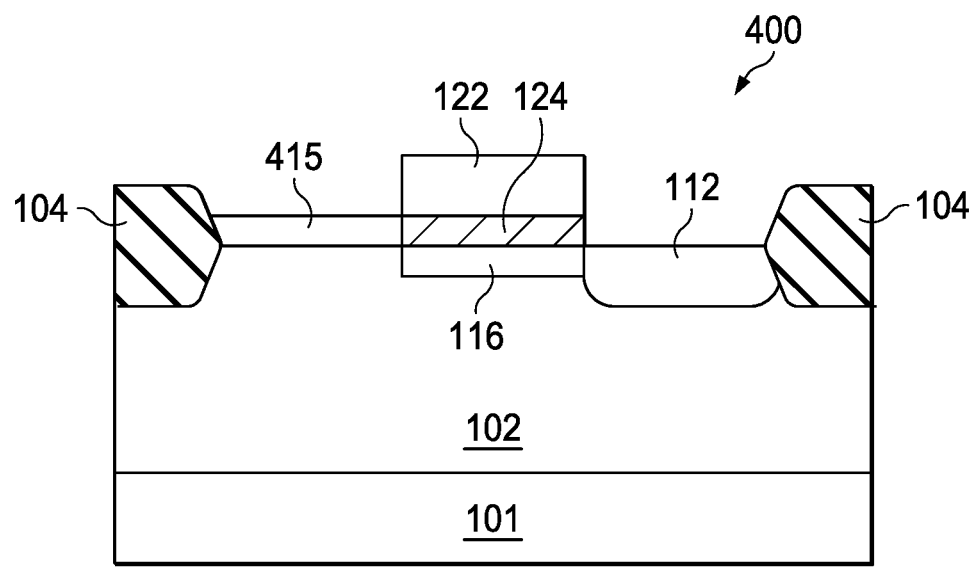
FIG. 4C shows a longitudinal cross-sectional view of the segregated regressive edge block MOS transistor according to an aspect of the present disclosure.

Referring to FIGS. 4A, 4C (cross-section E of FIG. 4A), 4D (cross-section F of FIG. 4A), and 4G-4H, several features of a segregated PEBMOS (SPEBMOS) transistor 400 are shown according to an aspect of the present disclosure. The SPEBMOS transistor 400 is similar to the PEBMOS transistor 302 with respect to their overall structures. Thus, several numeric labels of the SPEBMOS transistor 400 are adopted from the PEBMOS transistor 302 to the extent that these numeric labels refer to the structural features common to both transistors 302 and 400. The SPEBMOS transistor 400 is different from the PEBMOS transistor 302 in that the SPEBMOS transistor 400 includes one or more segregated progressive edge block (SPEB) regions 412. The SPEB regions 412 may be the same as the PEB regions 314 except that the SPEB regions 412 are segregated from the associated terminal region (e.g., the source terminal region 114 as shown in FIG. 4A) by one or more spacers 415. The spacers 415 can be formed by depositing an insulation layer (e.g., an oxide layer) on the top surface of the well 102 and between a junction between the SPEB region 412 and the terminal region (e.g., the source terminal regions 114). The spacers 416 servers as a metallization blockage means for preserving the junction from being subsequently metalized (e.g., formation of a contiguous titanium silicide layer). Thus, the spacer 416 helps prevent the SPEB region 412 from being electrically connected to the terminal region (e.g., the source terminal regions 114). By segregating the terminal region (e.g., 112 or 114) from the SPEB regions 412, the terminal region may be biased independently from the body region (e.g., a part of the well 102) of the SPEBMOS transistor 400.

Figure 4D:
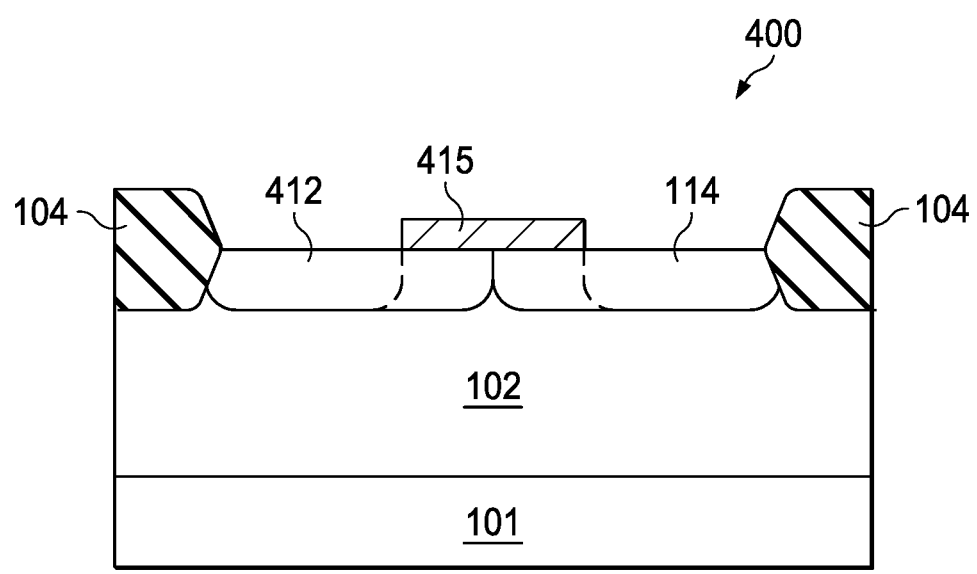
FIG. 4D shows a traverse cross-sectional view of the segregated regressive edge block MOS transistor according to an aspect of the present disclosure.

The SPEB regions 412 can be developed in a similar fashion as the PEB regions 314. For instance, the SPEB regions 412 can be developed by selectively implanting the well 102 with the REB mask 320 and the PEB mask 340. As shown in FIG. 4D, the SPEB region 412 may abut the terminal region 114 below the spacer 415. Alternatively, the SPEB regions 412 can be developed by selectively implanting the well 102 with a segregated regressive edge block (SREB) mask 420 and a SPEB mask 440. The SREB mask 420 is similar to the REB mask 320 except that the regressive edges 428 of the SREB mask 420 further regress to level with the center part of the channel region 116. As such, the first opening 422 does not overlap or interface with the channel edge regions 118. This further regression allows the terminal region 114 to be spaced apart (see dotted line shown in FIG. 4D) from the SPEB region 412 under the spacer 415. Such a spacing may help reduce the capacitive coupling between the SPEB region 412 and the terminal region 114.

The SPEB mask 440 is similar to the PEB mask 340 except that the openings 442 regress away from the center part of the channel region 116. As such, the SPEB mask 440 allows the SPEB region 412 to be spaced apart (see dotted line shown in FIG. 4D) from the terminal region 114 under the spacer 415. Such a spacing may help reduce the capacitive coupling between the SPEB region 412 and the terminal region 114. The SREB mask 420 and the SPEB mask 440 can be used in conjunction with the REB mask 320 or the PEB mask 340. In one implementation, for example, the SREB mask 420 may be used in conjunction with the PEB mask 340 to form the SPEBMOS 400. In another implementation, for example, the SPEB mask 440 may be used in conjunction with the REB mask 320 to form the SPEBMOS 500.

Figure 4E:
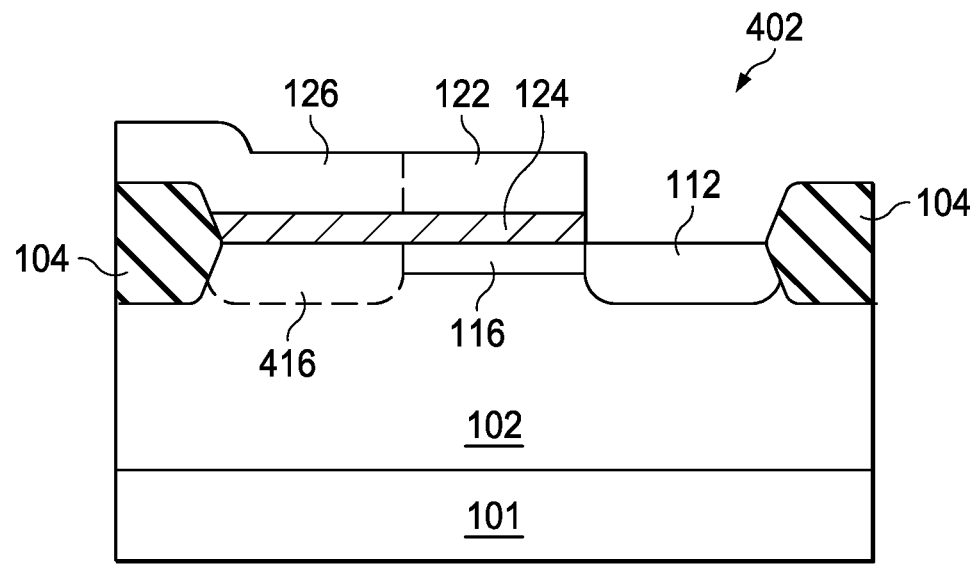
FIG. 4E shows a longitudinal cross-sectional view of the self-aligned segregated regressive edge block MOS transistor according to an aspect of the present disclosure.

Referring to FIGS. 4B, 4E (cross-section G of FIG. 4B), and 4F (cross-section H of FIG. 4B), several features of a self-aligned SPEBMOS (SASPEBMOS) transistor 402 are shown according to an aspect of the present disclosure. Except for a few modifications, the SASPEBMOS transistor 402 shares the same structures as the SPEBMOS transistor 400. The SASPEBMOS transistor 402 differs from the SPEBMOS transistor 400 only for a pair of extended gate electrodes 126. The extended gate electrodes 126 serve as a self-alignment means for preserving a spacer region 416 from being metalized (e.g., the formation of a titanium silicide layer) subsequent to the forming of the SPEB region 412 and the terminal region (e.g., 112 or 114). Thus, the pair of extended gate electrodes 126 facilitates the formation of the SPEB regions 412 by further partitioning the openings defined in the REB mask 320 and the PEB mask 340. To that end, the extended gate electrodes 126 help streamline the fabrication process and improve the process margin for forming SPEG regions 412.

Figure 4F:
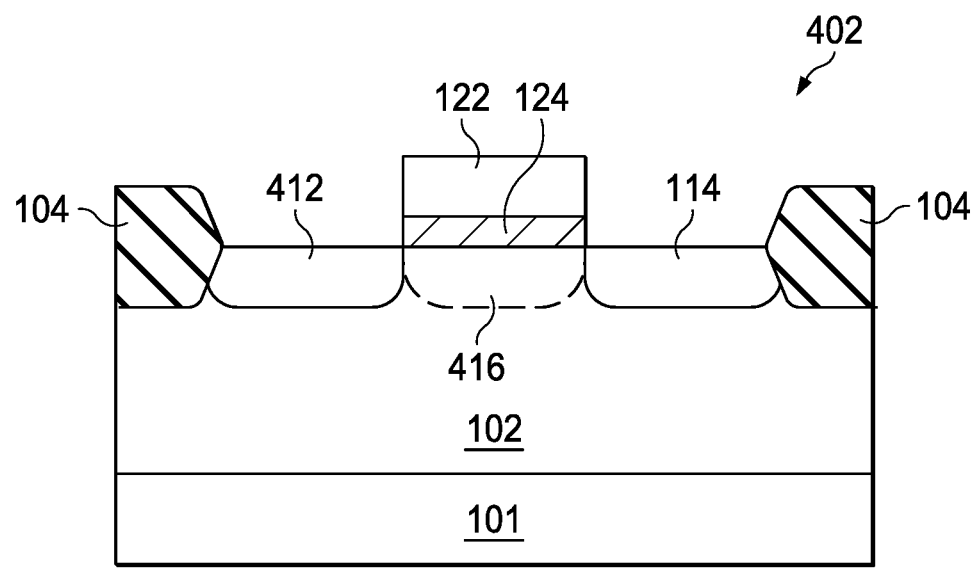
FIG. 4F shows a traverse cross-sectional view of the self-aligned segregated regressive edge block MOS transistor according to an aspect of the present disclosure.

The extended gate electrode 126 extends from the gate electrode 122, and it may be perpendicular to the gate electrode 122. The extended gate electrode 126 is positioned above the spacer region 416 to serve as a self-alignment means for forming the SPEB regions 412 and the adjacent terminal region (e.g., the source terminal region 114). The extended gate electrode 126 may further extend to overlap with the isolation structure 104 along the traverse direction. Optionally, a gate oxide layer 124 may be formed under the extended gate electrode 126 and directly on top of the spacer region 416. Like the gate electrode 122, the extended gate electrode 126 may include a polysilicon layer. Although FIGS. 4B and 4E-4F show that the extended gate electrode 126 serves as a self-alignment means for forming the SPEB regions 412, other similar structures may be used to serve as a self-alignment means as well. For instance, a dielectric layer shaped and positioned substantially the same way as the extended gate electrode 126 may be used to serve as a self-alignment means for forming the SPEB regions 412. Moreover, the extended gate electrode 126 serves as a metallization blockage means for preventing a junction between the SPEB region 412 and the terminal region (e.g., 112 or 114) from being metalized. Thus, the extended gate electrode 126 segregates the SPEB region 412 from the terminal region (e.g., 112 or 114) such that these two regions may be individually and separately biased.

Figures 5A, 5B:
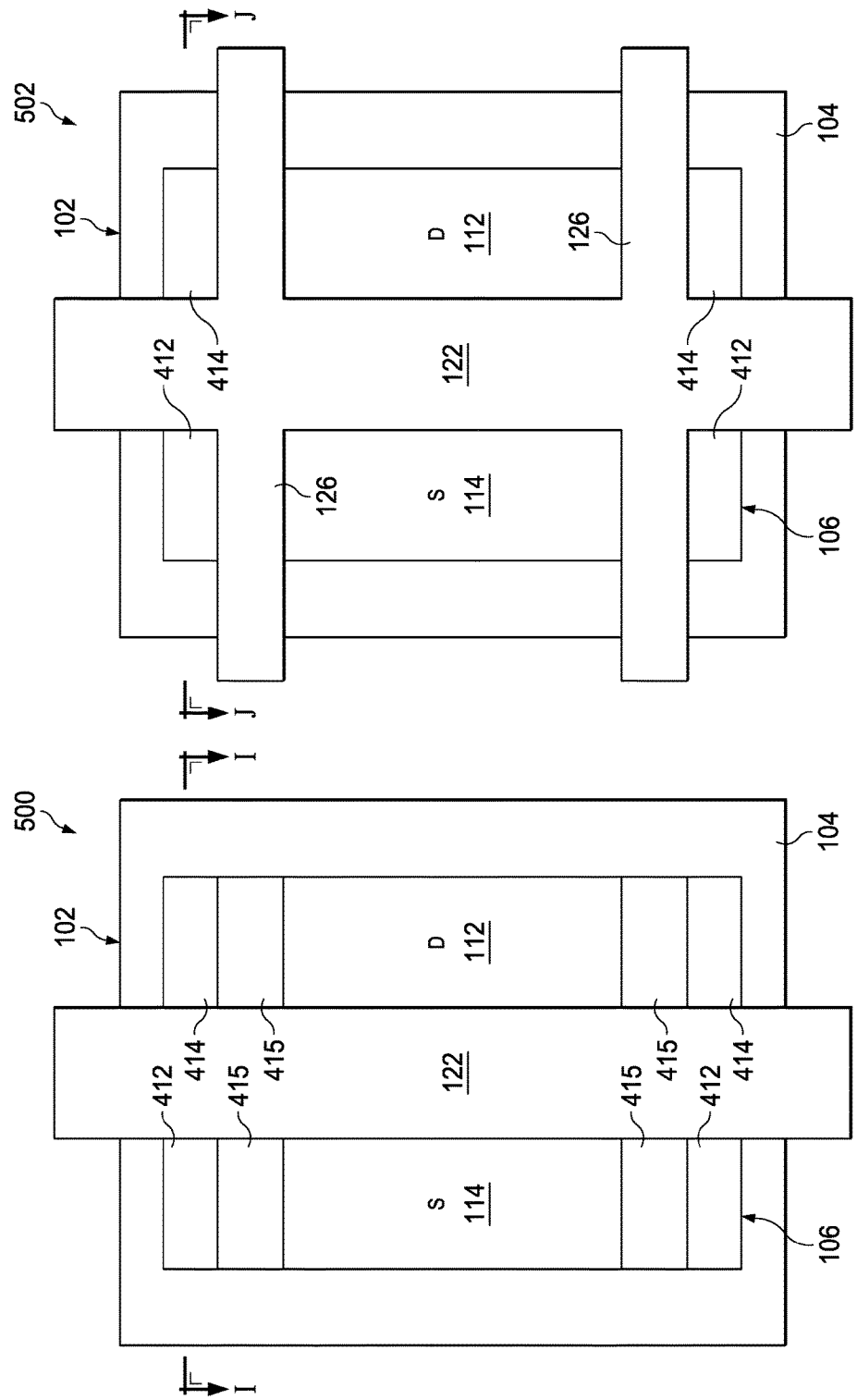
FIG. 5A shows a top view of a dual segregated regressive edge block MOS transistor according to an aspect of the present disclosure.
FIG. 5B shows a top view of a dual self-aligned segregated progressive edge block MOS transistor according to an aspect of the present disclosure.
Figure 5C:
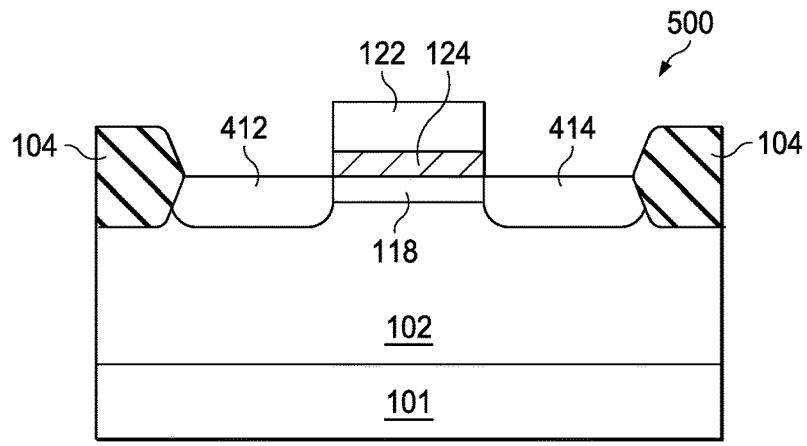
FIG. 5C shows a cross-sectional view of the dual segregated regressive edge block MOS transistor according to an aspect of the present disclosure.

When the edge block regions (e.g., 412) are segregated from the terminal regions (e.g., 114), the fabrication process may be further simplified by replicating the edge block regions to be adjacent to both the first terminal region 112 (e.g., a drain terminal) and the second terminal region 114 (e.g., a source terminal). Referring to FIGS. 5A, 5C (cross-section I of FIG. 5A), and 5D-5E, several features of a SPEBMOS transistor 500 are shown according to an aspect of the present disclosure. The SPEBMOS transistor 500 shares almost the identical structure as the SPEBMOS transistor 400 except that the SPEB regions 412 are replicated to the drain side of the transistor. The SPEBMOS transistor 500 includes a first SPEB region 412 positioned adjacent to the source terminal region 114, and a second SPEB region 414 positioned adjacent to the drain terminal region 112. In this configuration, the second SPEB region 414 opposes the first SPEB region 412 along the channel edge region 118.

Figure 4H:
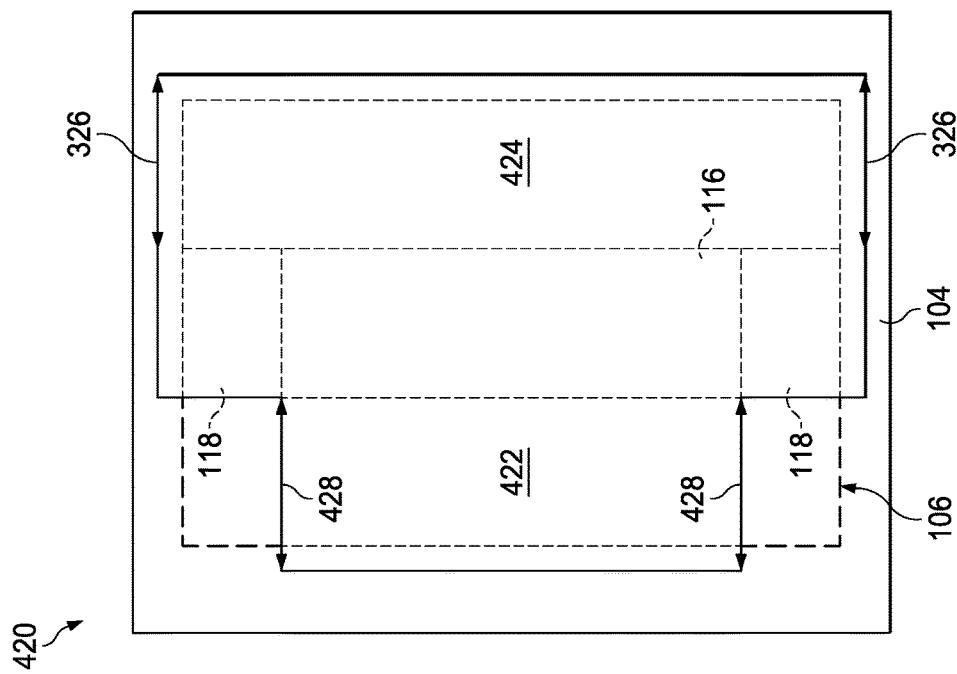
FIG. 4H shows a top view of a segregated progressive edge block mask according to an aspect of the present disclosure.
Figure 4G:
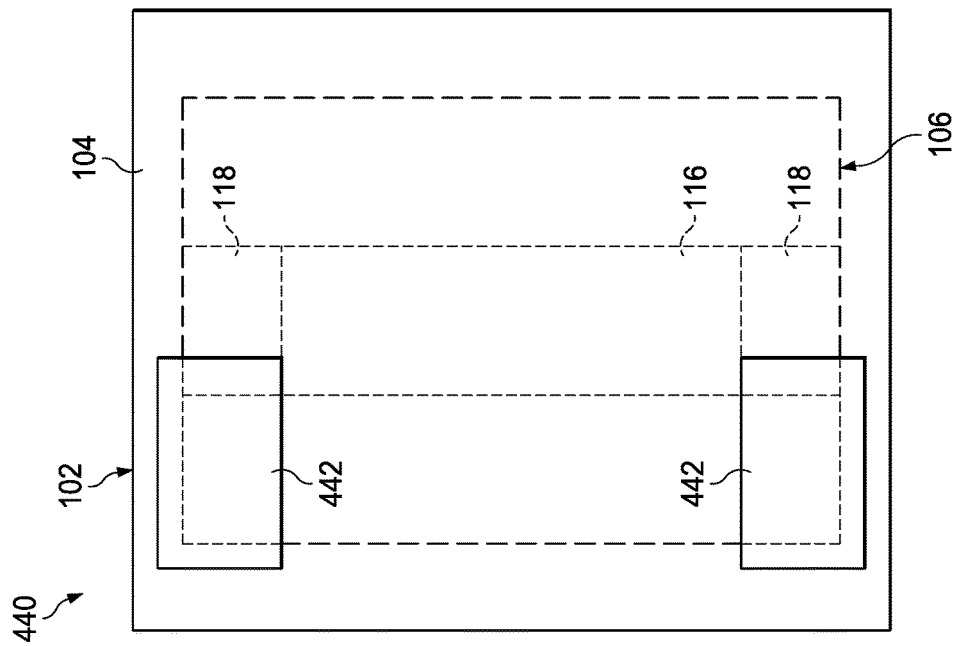
FIG. 4G shows a top view of a segregated regressive edge block mask according to an aspect of the present disclosure.

The first SPEB region 412 and the second SPEB region 414 can be developed with the same techniques as described in FIGS. 4A, 4C-4D, and 4G-4H excepted that the associated masks (e.g., the REB mask 320, the PEB mask 340, the SREB mask 420, and/or the SPEB mask 440) are modified to be symmetric along the channel region 116. For instance, a symmetric SREB mask 520 and a symmetric SPEB mask 540 may be used for developing the first SPEB region 412 and the second SPEB region 414. The symmetric SREB mask 520 defines a single opening 522 for implanting the first and second terminal regions 112 and 114. The single opening 522 includes a regressive edge 524, which is similar to the regressive edge 428 as shown in FIG. 4G. Unlike the regressive edge 428 however, the regressive edge 524 extends across the channel region 116 and the first terminal region 112. Moreover, the regressive edge 524 overlaps with two traverse sides of the isolation structure 104. The symmetric SPEB mask 540 includes an opening 542 which is modified based on the opening 442 as shown in FIG. 4H. The opening 542 extends across the channel edge region 118 to be adjacent to the first terminal region 112.

Referring to FIGS. 5B and 5F-5G, several features of a SASPEBMOS transistor 502 are shown according to an aspect of the present disclosure. The SASPEBMOS transistor 502 shares almost the identical structure as the SASPEBMOS transistor 402 except that the SPEB regions 412 and the extended gate electrodes 126 are replicated to the drain side of the transistor. The SASPEBMOS transistor 502 includes a first SPEB region 412 positioned adjacent to the source terminal region 114, and a second SPEB region 414 positioned adjacent to the drain terminal region 112. In this configuration, the second SPEB region 414 opposes the first SPEB region 412 along the channel edge region 118.

Because of the self-alignment feature provided by the extended gate electrodes 126, a modified version of the REB mask 320 and the PEB mask 340 can be used to form the SASPEBMOS transistor 502. For instance, a symmetric REB mask 560 defines a single opening 562 for implanting the first and second terminal regions 112 and 114. The single opening 522 includes a regressive edge 564, which is similar to the regressive edge 328 as shown in FIG. 3E. Unlike the regressive edge 328 however, the regressive edge 564 extends across the channel region 116 and the first terminal region 112. Moreover, the regress edge 564 overlaps with two traverse sides of the isolation structure 104. The symmetric PEB mask 540 includes an opening 582 which is modified based on the opening 342 as shown in FIG. 3F. The opening 582 extends across the channel edge region 118 to be adjacent to the first terminal region 112.

The symmetric REB mask 560 and the symmetric PEB mask 580 can also be used for forming the SPEBMOS transistor 500 in which the SPEB regions 412 and 412 may join the respective terminal regions 114 and 112 under the spacers 415. The symmetric REB mask 560 and the symmetric PEB mask 580 may also be used in conjunction with the symmetric SREB mask 520 and the symmetric SPEB mask 540. In one implementation, for example, the symmetric SREB mask 520 may be used in conjunction with the symmetric PEB mask 580 to form the SPEBMOS 500. In another implementation, for example, the symmetric SPEB mask 540 may be used in conjunction with the symmetric REB mask 540 to form the SPEBMOS 500.

Figure 6:
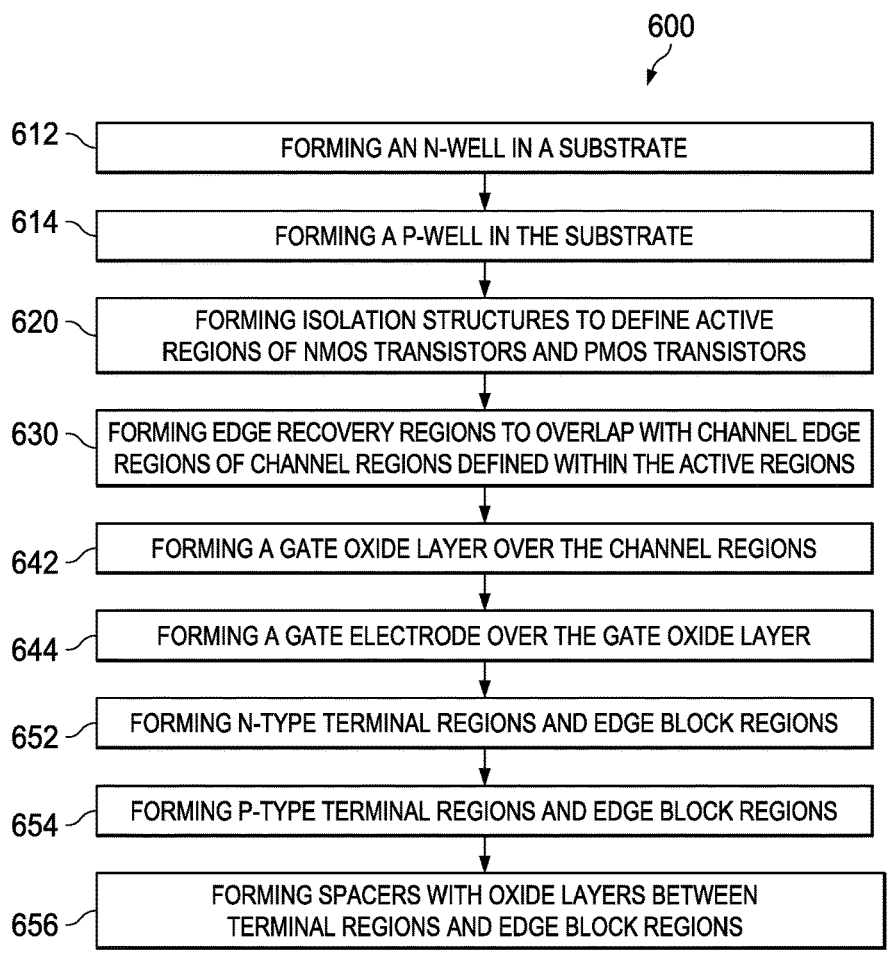
FIG. 6 shows a flow diagram of a process for manufacturing a MOS transistor according to an aspect of the present disclosure.
Figure 5E:
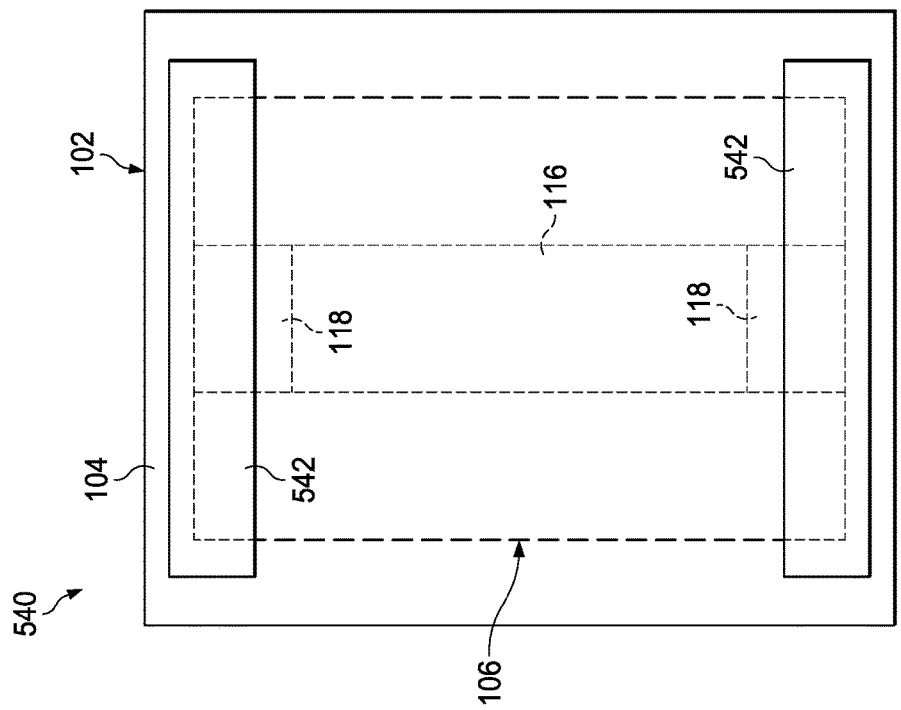
FIG. 5E shows a top view of a dual segregated progressive edge block mask according to an aspect of the present disclosure.
Figure 5D:
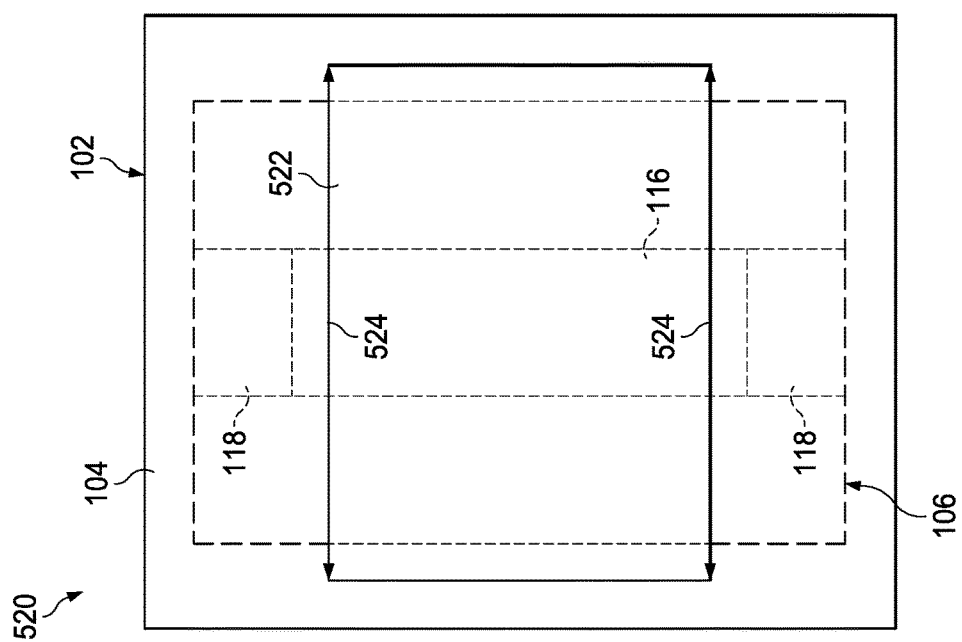
FIG. 5D shows a top view of a dual segregated regressive edge block mask according to an aspect of the present disclosure.

FIG. 6 shows a flow diagram of a process 600 for manufacturing a MOS transistor according to an aspect of the present disclosure. Consistent with the present disclosure, each of the disclosed MOS transistors (e.g., 100, 200, 202, 300, 302, 400, 402, 500, and 502) can be multiplied and alternated to form a transistor array having multiple channel fingers, source terminal fingers, and drain terminal fingers. The process 600 begins at either step 612 or step 614. Step 612 involves forming an n-well in a substrate, whereas step 614 involves forming a p-well in the substrate. Both the n-well and p-well can be represented by the well 102 as shown in FIGS. 1A-1B, 2A-2C, 3A-3D, 4A-4F, and 5A-5C. The forming of the n-well includes doping the substrate (e.g., the substrate 101) with an n-type dopant (e.g., phosphorous) and having a relatively low doping concentration. In one implementation, for example, the doping concentration of the n-well may ranges from $9 \times 10^{15}$ cm$^{-3}$ to $1 \times 10^{17}$ cm$^{-3}$. In another implementation, for example, the doping concentration of the n-well may ranges from $2 \times 10^{15}$ cm$^{-3}$ to $1 \times 10^{16}$ cm$^{-3}$. Several channel regions (e.g., 116) of p-channel devices (e.g., PMOS transistors) may be formed along with the n-well. The forming of the p-well includes doping the substrate (e.g., the substrate 101) with a p-type dopant (e.g., boron) and having a relatively low doping concentration. In one implementation, for example, the doping concentration of the p-well may ranges from $9 \times 10^{15}$ cm$^{-3}$ to $1 \times 10^{17}$ cm$^{-3}$. In another implementation, for example, the doping concentration of the p-well may ranges from $2 \times 10^{15}$ cm$^{-3}$ to $1 \times 10^{16}$ cm$^{-3}$. Several channel regions (e.g., 116) of n-channel devices (e.g., NMOS transistors) may be formed along with the p-well.

Upon completing steps 612 and 614, the process 600 proceeds to step 620, which involves forming isolation structures to define active transistor regions of NMOS transistors and PMOS transistors. The isolation structures can be represented by the isolation structure 104 as shown in FIGS. 1A-1B, 2A-2C, 3A-3D, 4A-4F, and 5A-5C. The isolation structures can be formed by a local oxidation of silicon (LOCOS) process or by a shallow trench isolation (STI) process. When the isolation structures are formed, the dopants residing in the channel edge regions (e.g., 118) may be prone to migrating into the isolation structures. Such a migration is more significant in NMOS transistors than in PMOS transistors. As a result of the dopant migration, the channel edge region's threshold voltage will drop, which may affect the subthreshold behaviors of the MOS transistors.

To alleviate or recover from the subthreshold distortions, step 630 may be performed to form one or more edge recovery regions. The edge recovery regions (e.g., 218 and/or 219) generally includes the same type of dopants as the channel regions (e.g., 116) and have a higher doping concentration than the channel regions. Step 630 can be performed consistent with the descriptions and illustrations of FIGS. 2A-2E. For instance, at least one of the masks 220 or 240 may be used for performing step 630.

Next, the process 600 proceeds to step 642, which involves forming a gate oxide layer (e.g., 124) over the channel regions (e.g., 116). The gate oxide layer may be a part of the self-alignment means and metallization blockage means as described in FIGS. 3A-3F, 4A-4H, and 5A-5G. Then, step 644 is performed, which involves forming a gate electrode (e.g., 122) over the gate oxide layer. Consistent with the descriptions and illustrations of FIGS. 4B, 4E-4F, 5B, 5C, and 5F-5G, the gate electrode may include an extension (e.g., 126) for self-aligning the edge block region to be segregated from the adjacent terminal region. Thus, like the gate oxide layer, the gate electrode may also be a part of the self-alignment means metallization blockage means as described in FIGS. 3A-3F, 4A-4H, and 5A-5G.

Next, the process 600 proceeds to either step 652 or step 654. In one implementation, step 652 can be performed before step 654. In another implementation, step 652 can be performed after step 654. Step 652 involves forming n-type terminal regions (e.g., 112 and 114) and edge block regions, which may include p-type regressive edge block regions (e.g., 312) and/or n-type progressive edge block regions (e.g., 314, 412, and/or 414). One or more n-type implantation masks can be used for performing step 652. In one implementation, step 652 may applies only a single n-type implantation mask. This single n-type implantation mask may incorporate the mask patterns (e.g., 320, 340, 420, 440, 520, 540, 560, and/or 580) as shown and described in FIGS. 3E-3F, 4G-4H, and/or 5D-5G.

Step 654 involves forming p-type terminal regions (e.g., 112 and 114) and edge block regions, which may include n-type regressive edge block regions (e.g., 312) and/or p-type progressive edge block regions (e.g., 314, 412, and/or 414). One or more p-type implantation masks can be used for performing step 654. In one implementation, step 654 may applies only a single p-type implantation mask. This single n-type implantation mask may incorporate the mask patterns (e.g., 320, 340, 420, 440, 520, 540, 560, and/or 580) as shown and described in FIGS. 3E-3F, 4G-4H, and/or 5D-5G.

Upon completing steps 652 and 654, the process 600 proceeds to step 656, which involves forming spacers with oxide layers between the terminal regions and the edge block regions. The spacers can be represented by the spacers 415 as shown in FIGS. 4A, 4C-4D, and 5A. The spacers serve as a metallization blockage means for preventing the metallization of junctions between the edge block regions and the terminal regions, thereby allowing these two regions to be biased individually and separately. After step 656, the process 600 will perform additional steps to metalize top surfaces of the terminal regions and the edge block regions and to form interconnect metal layers and dielectric layers above the substrate.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. An integrated circuit, comprising:
   a gate electrode; and
   a substrate having transistor regions spaced apart from one another, each of the transistor regions defined by a longitudinal dimension and a traverse dimension, each of the transistor regions including:
   a channel region positioned under the gate electrode and along the traverse dimension, the channel region having a channel edge region along the longitudinal dimension;
   a terminal region positioned adjacent to the channel region; and
   an edge block region positioned along the longitudinal dimension and adjacent to the channel edge region, the edge block region doped to prevent the channel edge region from conducting a current when the gate electrode receives a subthreshold voltage.

2. The integrated circuit of claim 1, wherein:
   the terminal region includes:
   a drain region; and
   a source region separated from the drain region by the channel region; and
   the edge block region is positioned adjacent to the source region and opposes the drain region along the channel edge region.

3. The integrated circuit of claim 1, wherein:
   the terminal region includes:
   a drain region; and
   a source region separated from the drain region by the channel region; and
   the edge block region is positioned adjacent to the drain region and opposes the source region along the channel edge region.

4. The integrated circuit of claim 1, wherein:
   the terminal region includes:
   a drain region; and
   a source region separated from the drain region by the channel region; and
   the edge block region includes:
   a first edge block region positioned adjacent to the source region; and
   a second edge block region positioned adjacent to the drain region, the second edge block region opposing the first edge block region along the channel edge region.

5. The integrated circuit of claim 1, wherein the edge block region is coupled to the terminal region.

6. The integrated circuit of claim 1, wherein the edge block region is segregated from the terminal region.

7. The integrated circuit of claim 1, wherein the gate electrode includes:
   a first portion extending above and along the channel region; and
   a second portion extending from the first portion and above a spacer region of the substrate, the spacer region separating the edge block region from the terminal region.

8. The integrated circuit of claim 1, wherein:
   the channel region includes a channel main region having a first doping concentration; and
   the channel edge region is positioned adjacent to the channel main region, the channel edge region having a second doping concentration lower than the first doping concentration.

9. The integrated circuit of claim 1, wherein the terminal region doped with a first dopant of a first conductivity type, and the edge block region doped with a second dopant of a second conductivity type opposite to the first conductivity type.

10. The integrated circuit of claim 9, wherein the first conductivity type includes an n-type and the second conductivity type includes a p-type.

11. An integrated circuit, comprising:
a substrate having transistor regions spaced apart from one another, each of the transistor regions defined by a longitudinal dimension and a traverse dimension, each of the transistor regions including:
  a channel region positioned along the traverse dimension, the channel region having a channel edge region along the longitudinal dimension;
  an terminal region positioned adjacent to the channel region, the terminal region doped with n-type dopants; and
  an edge block region positioned in the terminal region and adjacent to the channel edge region, the edge block region doped with p-type dopants; and
a gate electrode positioned above the channel region of each of the transistor regions.

12. The integrated circuit of claim 11, wherein:
the terminal region includes:
  a drain region; and
  a source region separated from the drain region by the channel region; and
the edge block region is positioned in the source region and opposes the drain region along the channel edge region.

13. The integrated circuit of claim 11, wherein:
the terminal region includes:
  a drain region; and
  a source region separated from the drain region by the channel region; and
the edge block region is positioned in the drain region and opposes the source region along the channel edge region.

14. The integrated circuit of claim 11, wherein the edge block region is coupled to the terminal region.

15. The integrated circuit of claim 11, wherein the edge block region is segregated from the terminal region.

16. The integrated circuit of claim 11, wherein the gate electrode includes:
  a first portion extending above and along the channel region; and
  a second portion extending from the first portion and above a spacer region of the substrate, the spacer region separating the edge block region from the terminal region.

17. The integrated circuit of claim 11, wherein:
the channel region includes a channel main region having a first doping concentration; and
the channel edge region is positioned adjacent to the channel main region, the channel edge region having a second doping concentration lower than the first doping concentration.

18. An integrated circuit, comprising:
a gate electrode; and
a substrate having transistor regions spaced apart from one another, each of the transistor regions defined by a longitudinal dimension and a traverse dimension, each of the transistor regions including:
  a channel region positioned under the gate electrode and along the traverse dimension, the channel region having a channel edge region along the longitudinal dimension; and
  an edge recovery region overlapping with the channel edge region, the edge recovery region doped to prevent the channel edge region from conducting a current when the gate electrode receives a subthreshold voltage.

19. The integrated circuit of claim 18, wherein the channel region doped with a dopant and having a first doping concentration, and the edge recovery region doped with the dopant and having a second doping concentration higher than the first doping concentration.

20. The integrated circuit of claim 18, wherein the edge recovery region extends along the longitudinal dimension and beyond the channel edge region.

* * * * *